United States Patent
Baek et al.

(10) Patent No.: US 11,695,002 B2
(45) Date of Patent: Jul. 4, 2023

(54) INTEGRATED CIRCUIT INCLUDING INTEGRATED STANDARD CELL STRUCTURE

(71) Applicant: Samsung Electronics Co., Ltd., Suwon-si (KR)

(72) Inventors: Sanghoon Baek, Seoul (KR); Myung Gil Kang, Suwon-si (KR); Jae-Ho Park, Suwon-si (KR); Seung Young Lee, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 17/720,153

(22) Filed: Apr. 13, 2022

(65) Prior Publication Data
US 2022/0246601 A1 Aug. 4, 2022

Related U.S. Application Data

(63) Continuation of application No. 16/842,053, filed on Apr. 7, 2020, now Pat. No. 11,329,039.

(30) Foreign Application Priority Data

Sep. 9, 2019 (KR) .................. 10-2019-0111302

(51) Int. Cl.
| | |
|---|---|
| H01L 27/02 | (2006.01) |
| H01L 27/092 | (2006.01) |
| H01L 29/786 | (2006.01) |
| H01L 29/06 | (2006.01) |
| H01L 29/423 | (2006.01) |
| H01L 27/118 | (2006.01) |

(52) U.S. Cl.
CPC ........ *H01L 27/0207* (2013.01); *H01L 27/092* (2013.01); *H01L 27/11807* (2013.01); *H01L 29/0649* (2013.01); *H01L 29/0673* (2013.01); *H01L 29/42392* (2013.01); *H01L 29/78696* (2013.01)

(58) Field of Classification Search
CPC ............. H01L 27/0203; H01L 27/0207; H01L 27/092; H01L 27/11807; H01L 29/0649
See application file for complete search history.

(56) References Cited

U.S. PATENT DOCUMENTS

| | | |
|---|---|---|
| 6,618,847 B1 | 9/2003 | Hulse et al. |
| 7,257,790 B2 | 8/2007 | Maeda |
| 9,209,179 B2 | 12/2015 | Lee et al. |

(Continued)

*Primary Examiner* — Victoria K. Hall
(74) *Attorney, Agent, or Firm* — Muir Patent Law, PLLC

(57) ABSTRACT

An integrated circuit includes first and second active regions, first and second standard cells on the first active region and the second active region, and a filler cell between the first and second standard cells and including first and second insulating isolations. The filler cell has a one-pitch dimension. The first and second insulating isolations are spaced the one-pitch dimension apart from each other. The first insulating isolation of the filler cell is disposed at a first boundary between the first standard cell and the filler cell. The second insulating isolation of the filler cell is disposed at a second boundary between the second standard cell and the filler cell. The first and second insulating isolations separate at least a part of the first active region, and at least a part of the second active region.

20 Claims, 37 Drawing Sheets

(56) References Cited

U.S. PATENT DOCUMENTS

| | | | |
|---|---|---|---|
| 9,547,741 | B2 | 1/2017 | Schroeder et al. |
| 9,984,932 | B1 | 5/2018 | Zang et al. |
| 10,090,289 | B1 | 10/2018 | Hsu et al. |
| 10,192,859 | B2 | 1/2019 | Aton et al. |
| 10,276,554 | B1 * | 4/2019 | Chen .................. H01L 27/092 |
| 10,361,198 | B2 | 7/2019 | Rastogi et al. |
| 10,635,775 | B2 | 4/2020 | Lee et al. |
| 10,817,640 | B2 | 10/2020 | Kim et al. |
| 10,867,101 | B1 * | 12/2020 | Lin .................. H01L 21/823821 |
| 10,879,270 | B2 | 12/2020 | Shimbo |
| 11,094,695 | B2 | 8/2021 | Liaw |
| 11,114,366 | B2 | 9/2021 | Liaw |
| 11,329,039 | B2 * | 5/2022 | Baek .................. H01L 27/092 |
| 2009/0113368 | A1 | 4/2009 | Lin et al. |
| 2010/0044755 | A1 | 2/2010 | Tsuda et al. |
| 2011/0258588 | A1 | 10/2011 | Sharma et al. |
| 2011/0278592 | A1 | 11/2011 | Tsuboi et al. |
| 2014/0239410 | A1 * | 8/2014 | Yang .................. H01L 27/11807 257/390 |
| 2014/0283147 | A1 | 9/2014 | Tehranipoor et al. |
| 2015/0102413 | A1 | 4/2015 | Azmat et al. |
| 2015/0171091 | A1 | 6/2015 | Lytle |
| 2017/0053917 | A1 | 2/2017 | Azmat et al. |
| 2017/0287933 | A1 | 10/2017 | Chen et al. |
| 2018/0006010 | A1 | 1/2018 | Lo et al. |
| 2018/0102364 | A1 | 4/2018 | Rastogi et al. |
| 2018/0144988 | A1 | 5/2018 | Liou et al. |
| 2018/0226336 | A1 * | 8/2018 | Kim .................. H01L 29/788 |
| 2018/0365368 | A1 * | 12/2018 | Do .................. G06F 30/392 |
| 2019/0012423 | A1 | 1/2019 | Lee et al. |
| 2019/0148242 | A1 | 5/2019 | Zang et al. |
| 2019/0148373 | A1 | 5/2019 | Shi et al. |
| 2019/0164993 | A1 | 5/2019 | Shimbo |
| 2019/0188353 | A1 | 6/2019 | Correale et al. |
| 2019/0220568 | A1 | 7/2019 | Ryu et al. |
| 2019/0386000 | A1 | 12/2019 | Chen et al. |
| 2020/0083223 | A1 | 3/2020 | Chang et al. |
| 2020/0098858 | A1 * | 3/2020 | Yang .................. H01L 29/0649 |
| 2020/0104446 | A1 | 4/2020 | Li et al. |
| 2020/0151298 | A1 | 5/2020 | Kim et al. |
| 2020/0365589 | A1 * | 11/2020 | Liaw .................. H01L 27/0207 |
| 2021/0098338 | A1 * | 4/2021 | Liaw .................. H01L 27/092 |
| 2021/0134784 | A1 | 5/2021 | Kim et al. |
| 2021/0343699 | A1 | 11/2021 | Kim et al. |

* cited by examiner

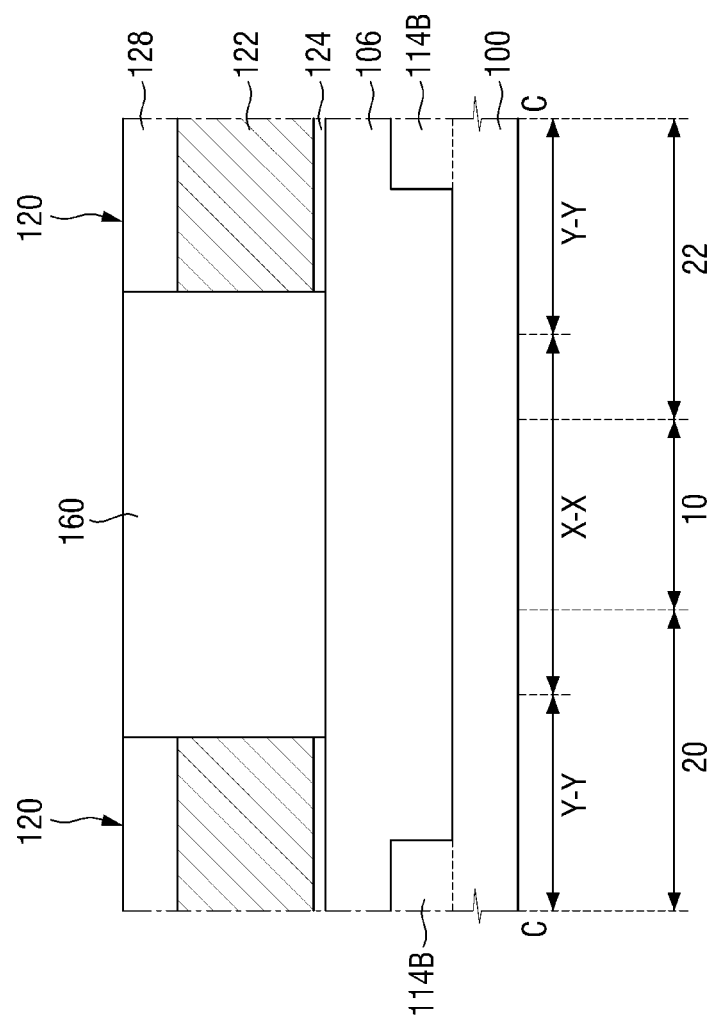

INTEGRATED CIRCUIT INCLUDING INTEGRATED STANDARD CELL STRUCTURE

This application is a continuation of U.S. application Ser. No. 16/842,053 filed on Apr. 7, 2020, which claims priority under 35 U.S.C. § 119 to Korean Patent Application No. 10-2019-0111302, filed on Sep. 9, 2019 in the Korean Intellectual Property Office, the disclosures of each of which are incorporated by reference herein in its entirety.

BACKGROUND

1. Technical Field

The present inventive concept relates to an integrated circuit including an integrated standard cell structure.

2. Description of the Related Art

An integrated circuit may be designed using standard cells. Specifically, a layout of the integrated circuit may be generated by placing standard cells in accordance with data defining the integrated circuit and by routing the placed standard cells. Such standard cells are predesigned and stored in a cell library.

As the semiconductor fabricating process is miniaturized, the sizes of patterns in the standard cells may decrease, and the size of the standard cell may also decrease.

SUMMARY

Embodiments of the present inventive concept provide an integrated circuit that may improve a degree of integration of the layout and improve the performance and reliability of a designed semiconductor device, using filler cells.

However, embodiments of the present inventive concept are not restricted to the one set forth herein. The above and other embodiments of the present inventive concept will become more apparent to one of ordinary skill in the art to which the present inventive concept pertains by referencing the detailed description of the present inventive concept given below.

According to an exemplary embodiment of the present invention, an integrated circuit includes a first active region extending in a first direction, a second active region extending in the first direction and spaced apart from the first active region in a second direction different from the first direction, a first standard cell disposed on the first active region and the second active region, the first standard cell including a first p-type transistor (pFET) on the first active region and a first n-type transistor (nFET) on the second active region, a second standard cell disposed on the first active region and the second active region, the second standard cell including a second p-type transistor on the first active region and a second n-type transistor on the second active region, and a filler cell which is disposed between the first standard cell and the second standard cell and includes a first insulating isolation and a second insulating isolation, each of the first insulating isolation and the second insulating isolation extending in the second direction. The filler cell has a one-pitch dimension. The first insulating isolation and the second insulating isolation are spaced the one-pitch dimension apart from each other in the first direction. The first insulating isolation of the filler cell is disposed at a first boundary between the first standard cell and the filler cell. The second insulating isolation of the filler cell is disposed at a second boundary between the second standard cell and the filler cell. The first insulating isolation and the second insulating isolation separate at least a part of the first active region and at least a part of the second active region.

According to an exemplary embodiment of the present invention, an integrated circuit includes a first standard cell including a first p-type transistor (pFET) and a first n-type transistor (nFET), a second standard cell which includes a second p-type transistor and a second n-type transistor and is spaced apart from the first standard cell in a first direction, a filler cell which is disposed between the first standard cell and the second standard cell and includes a first insulating isolation and a second insulating isolation, and a third standard cell spaced apart from the first standard cell and the filler cell in a second direction different from the first direction and includes a third p-type transistor and a third n-type transistor. The filler cell has a one-pitch dimension. The first insulating isolation and the second insulating isolation are spaced the one-pitch dimension apart from each other in the first direction. The first insulating isolation of the filler cell is disposed at a boundary between the first standard cell and the filler cell. The second insulating isolation of the filler cell is disposed at a boundary between the second standard cell and the filler cell. The first p-type transistor and the second p-type transistor are formed on a first active region. The first n-type transistor and the second n-type transistor are formed on a second active region. The third standard cell includes a third insulating isolation disposed at a first boundary of the third standard cell. The first insulating isolation and the second insulating isolation separate at least a part of the first active region. The first insulating isolation and the second insulating isolation separate at least a part of the second active region. The third insulating isolation is aligned, in the second direction, with the second insulating isolation.

According to an exemplary embodiment of the present invention, an integrated circuit includes a first standard cell including a first p-type transistor (pFET) and a first n-type transistor (nFET), a second standard cell which includes a second p-type transistor and a second n-type transistor and is spaced apart from the first standard cell in a first direction, a filler cell which is disposed between the first standard cell and the second standard cell, and includes a first insulating isolation and a second insulating isolation, and a third standard cell which is spaced apart from the first standard cell and the filler cell in a second direction different from the first direction, and includes a third p-type transistor and a third n-type transistor. The filler cell has a one-pitch dimension. The first insulating isolation and the second insulating isolation are spaced the one-pitch dimension apart from each other in the first direction. The first insulation isolation of the filler cell is disposed at a boundary between the first standard cell and the filler cell. The second insulation isolation of the filler cell is disposed at a boundary between the second standard cell and the filler cell. The third standard cell includes a first gate stack and a second gate stack spaced apart from each other by the one-pitch dimension. The first gate stack is aligned, in the second direction, with the first insulating gate of the filler cell. The second gate stack is aligned, in the second direction, with the second insulating gate of the filler cell.

According to an exemplary embodiment of the present invention, an integrated circuit includes a first standard cell including a first p-type transistor (pFET) and a first n-type transistor (nFET), a second standard cell which includes a second p-type transistor and a second n-type transistor and is spaced apart from the first standard cell in a first direction, a filler cell which includes a first dummy gate stack and a second dummy gate stack, the filler cell disposed between the first standard cell and the second standard cell, wherein each of the first dummy gate stack and the second dummy gate stack extends in a second direction different from the first direction, a power rail extending in the first direction and connected to the first dummy gate stack and the second dummy gate stack, and a cell separation film extending in the first direction along a boundary of the first standard cell, a boundary of the filler cell and a boundary of the second standard cell, and overlapping the power rail. The filler cell has a one-pitch dimension. The first dummy gate stack and the second dummy gate stack are spaced the one-pitch dimension apart from each other in the first direction. The first dummy gate stack of the filler cell is disposed at a boundary between the first standard cell and the filler cell. The second dummy gate stack of the filler cell is disposed at a boundary between the second standard cell and the filler cell. The filler cell includes a first filler contact connected to the first dummy gate stack, and a second filler contact connected to the second dummy gate stack. The first filler contact and the second filler contact overlap the separation film.

According to an exemplary embodiment of the present invention, an integrated circuit includes a first standard cell including a first p-type transistor (pFET) and a first n-type transistor (nFET), a second standard cell which includes a second p-type transistor and second n-type transistor and is disposed to be adjacent to each other in a first direction, a filler cell which includes a first dummy gate stack and a second dummy gate stack disposed between the first standard cell and the second standard cell, the first floating dummy stack and the second dummy gate extending in a second direction different from the first direction, and a power rail extending in the first direction and connected to the first dummy gate stack and the second dummy gate stack. The filler cell has a one-pitch dimension. The first dummy gate stack and the second dummy gate stack are spaced the one-pitch dimension apart from each other in the first direction. The first dummy gate stack of the filler cell is disposed at a boundary between the first standard cell and the filler cell. The second dummy gate stack of the filler cell is disposed at a boundary between the second standard cell and the filler cell. The first standard cell includes a first gate stack extending in the second direction. The second standard cell includes a second gate stack extending in the second direction. A length of each of the first floating dummy stack and the second dummy gate stack is greater than a length of each of the first gate stack and the second gate stack.

According to an exemplary embodiment of the present invention, an integrated circuit includes a first standard cell including a first p-type transistor (pFET) and a first n-type transistor (nFET), a second standard cell which includes a second p-type transistor and a second n-type transistor and is spaced apart from the first standard cell in a first direction, a filler cell which includes a first dummy gate stack and a second dummy gate stack disposed between the first standard cell and the second standard cell, a first filler contact connected to the first dummy gate stack, and a second filler contact connected to the second dummy gate stack, the first dummy gate stack and the second dummy gate stack extending in a second direction different from the first direction, and a power rail extending in the first direction and connected to the first dummy gate stack via the first filler contact and the second dummy gate stack via the second filler contact. The filler cell has a one-pitch dimension. The first dummy gate stack and the second dummy gate stack are spaced the one-pitch dimension apart from each other in the first direction. The first dummy gate stack of the filler cell is disposed at a boundary between the first standard cell and the filler cell. The second dummy gate stack of the filler cell is disposed at a boundary between the second standard cell and the filler cell. The first p-type transistor and the second p-type transistor are formed on a first active region. The first n-type transistor and the second n-type transistor are formed on a second active region. The filler cell further includes a dummy gate cutting pattern on an active region separation film extending in the first direction across between the first active region and the second active region. The first dummy gate stack includes a first portion and a second portion separated by the dummy gate cutting pattern. The second dummy gate stack includes a first portion and a second portion separated by the dummy gate cutting pattern. The first filler contact includes a first upper filler contact connected to the first portion of the first dummy gate stack, and a first lower filler contact connected to the second portion of the first dummy gate stack. The second filler contact includes a second upper dummy contact connected to the first portion of the second dummy gate stack, and a second lower filler contact connected to the second portion of the second dummy gate stack. The first upper filler contact, the first lower filler contact, the second upper filler contact, and the second lower filler contact overlap a cell separation film extending in the first direction along a boundary of the first standard cell, a boundary of the filler cell, and a boundary of the second standard cell.

Other features and embodiments may be apparent from the following detailed description, the drawings, and the claims.

BRIEF DESCRIPTION OF THE DRAWINGS

The above and other aspects and features of the present inventive concept will become more apparent by describing in detail exemplary embodiments thereof with reference to the attached drawings, in which:

FIGS. 1 to 3, 4A and 4B, 5A and 5B, 6A to 6C, 7A and 7B, 8, 9, and 10A and 10B are diagrams for explaining an integrated circuit according to some embodiments;

DETAILED DESCRIPTION OF THE EMBODIMENTS

In the following description, an integrated circuit of various embodiments formed on a substrate (100 of FIG. 2), for example, a semiconductor substrate is provided. The integrated circuit has a layout that includes various standard cells. The standard cells are integrated circuit structures that are predesigned for being repeatedly used in the design of individual integrated circuits. Effective integrated circuit design layouts include predefined rules related to an arrangement of the standard cells to enhance performance of the predesigned various standard cells and the circuit and reduce a circuit area.

The integrated circuit according to some embodiments includes one or more standard cells disposed in an integrated circuit layout by predefined rules. Such standard cells are used repeatedly in the integrated circuit design. Therefore, the standard cells are predesigned in accordance with a fabricating technique and stored in a standard cell library. An integrated circuit designer may search for such standard cells and cause them to be included in an integrated circuit design and may dispose them in the integrated circuit layout in accordance with a predefined arrangement rule.

The standard cells may include various basic circuit devices, such as an inverter, an AND, a NAND, an OR, a XOR, and a NOR, frequently used in the digital circuit design for an electronic device such as a central processing unit (CPU), a graphic processing unit (GPU) and a system on chip (SOC) design. The standard cell may include other cells that are frequently used in a circuit block, such as a flip-flop and a latch.

A filler cell may be a designed block of the integrated circuit that is inserted between two adjacent standard cells to comply with the integrated circuit design and the integrated circuit fabricating rule. Proper design and arrangement of the standard cells and the filler cells may enhance packing density and circuit performance.

FIGS. 1 to 10B are diagrams for explaining an integrated circuit according to some embodiments.

Figure 1:
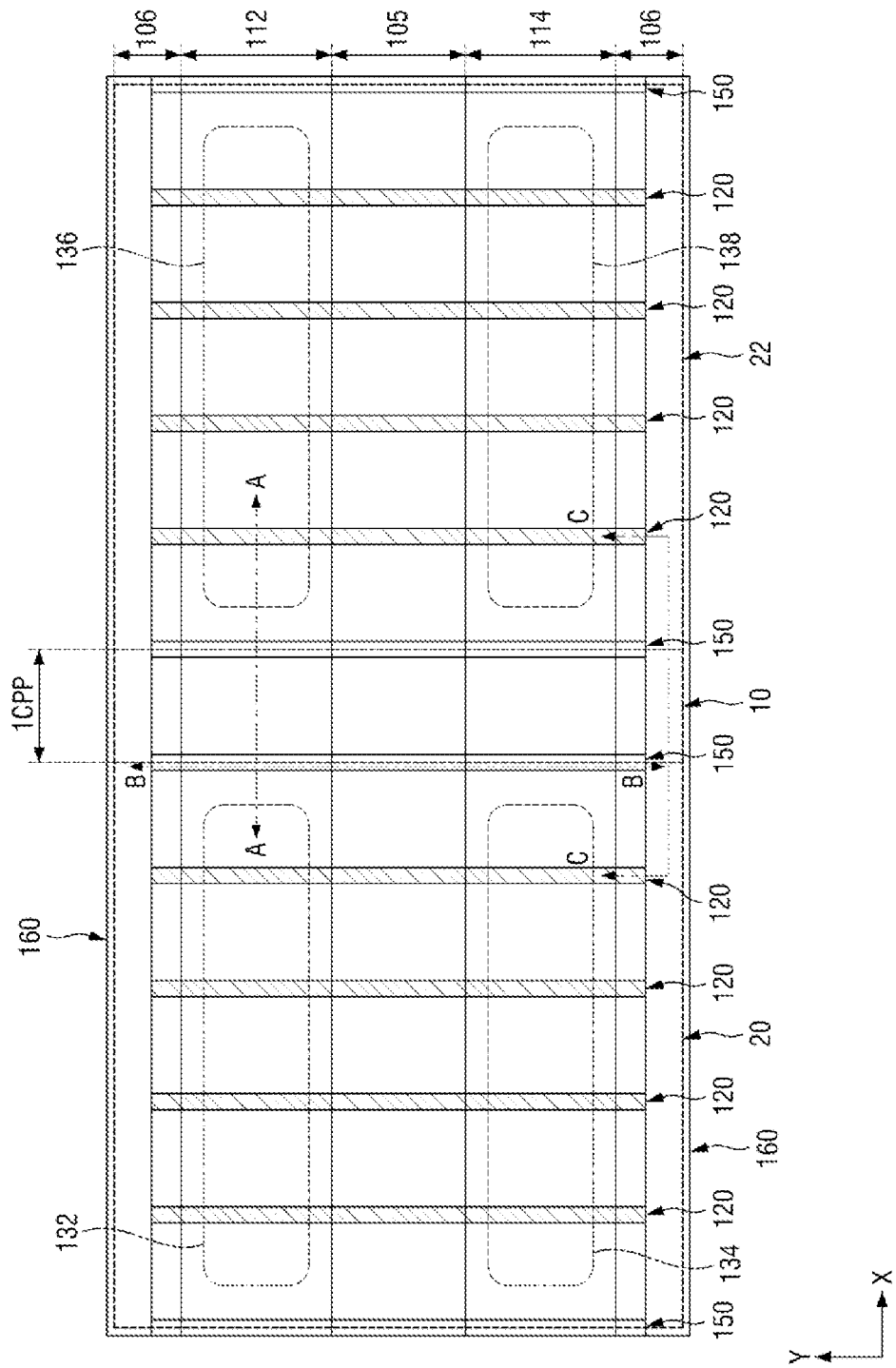
Figure 2:
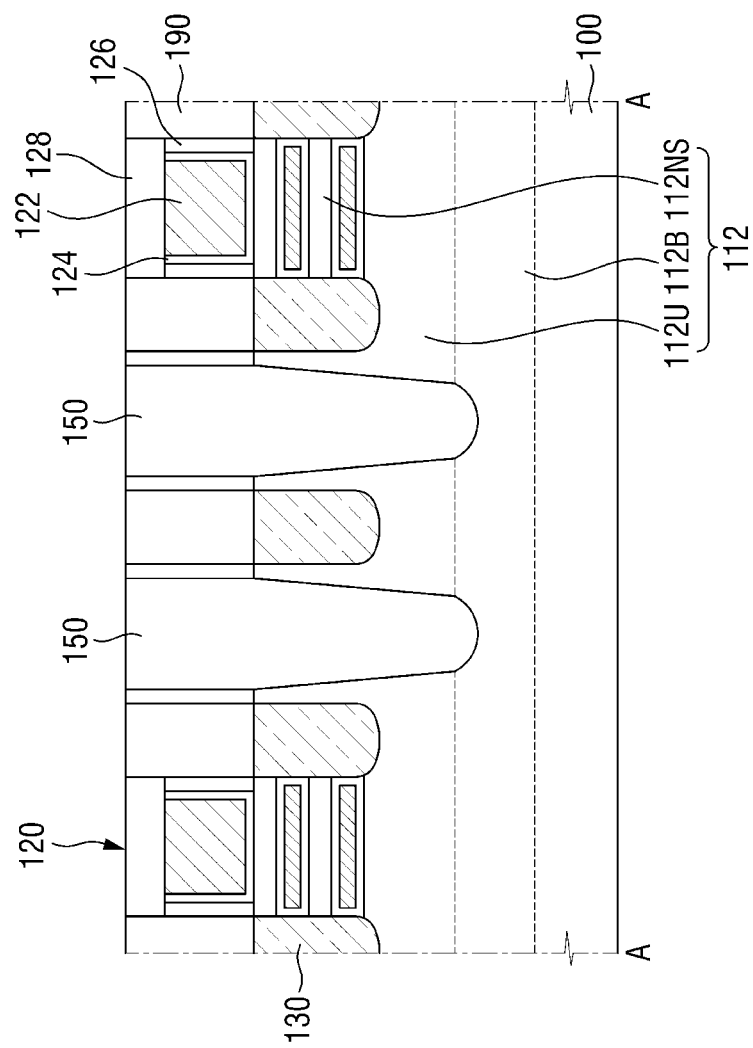
Figure 3:
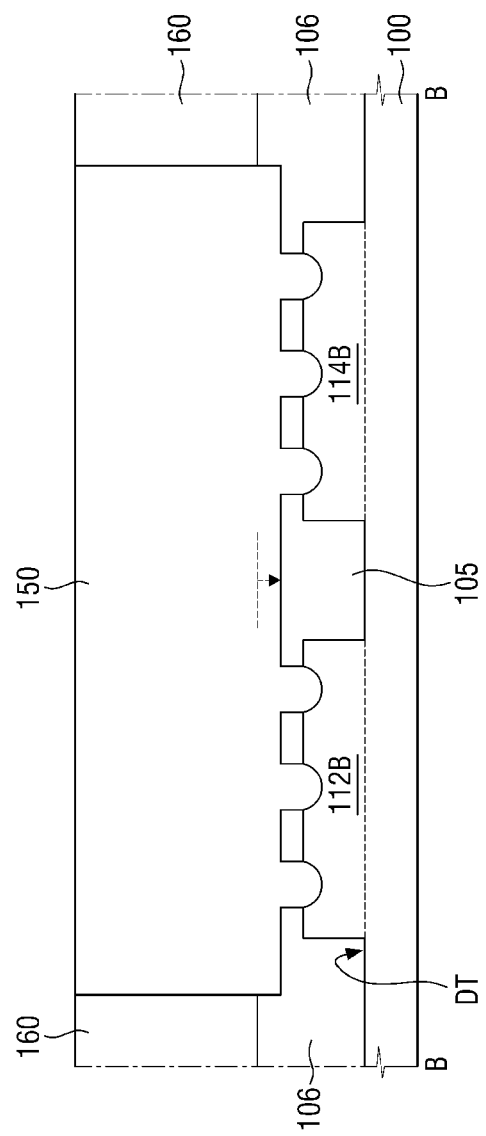
Figure 4B:
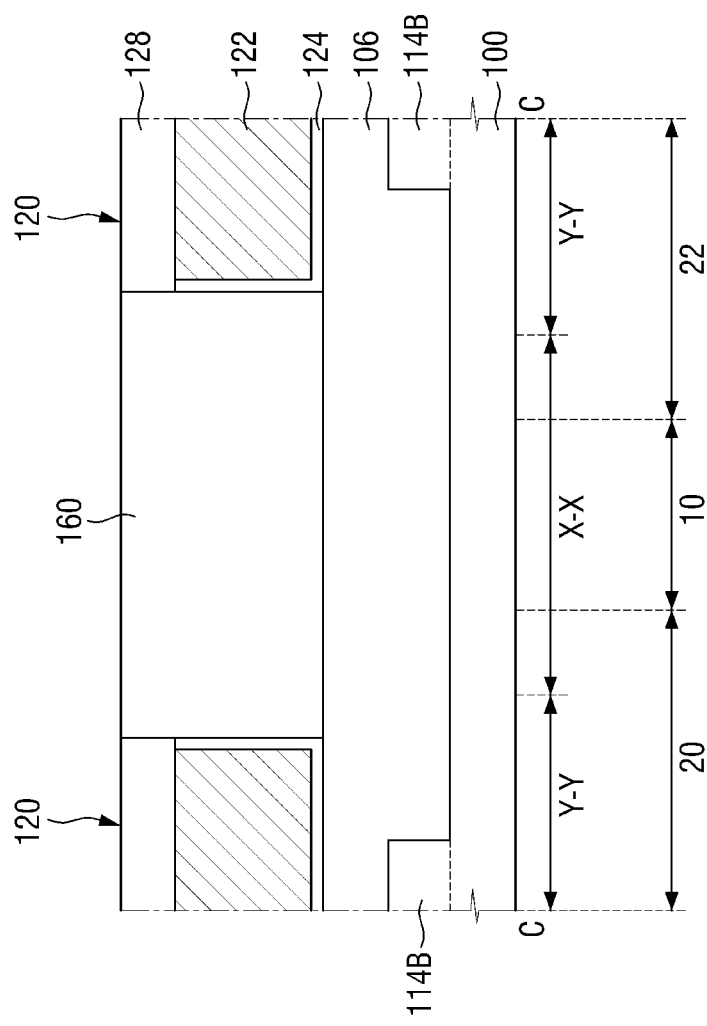
Figure 5A:
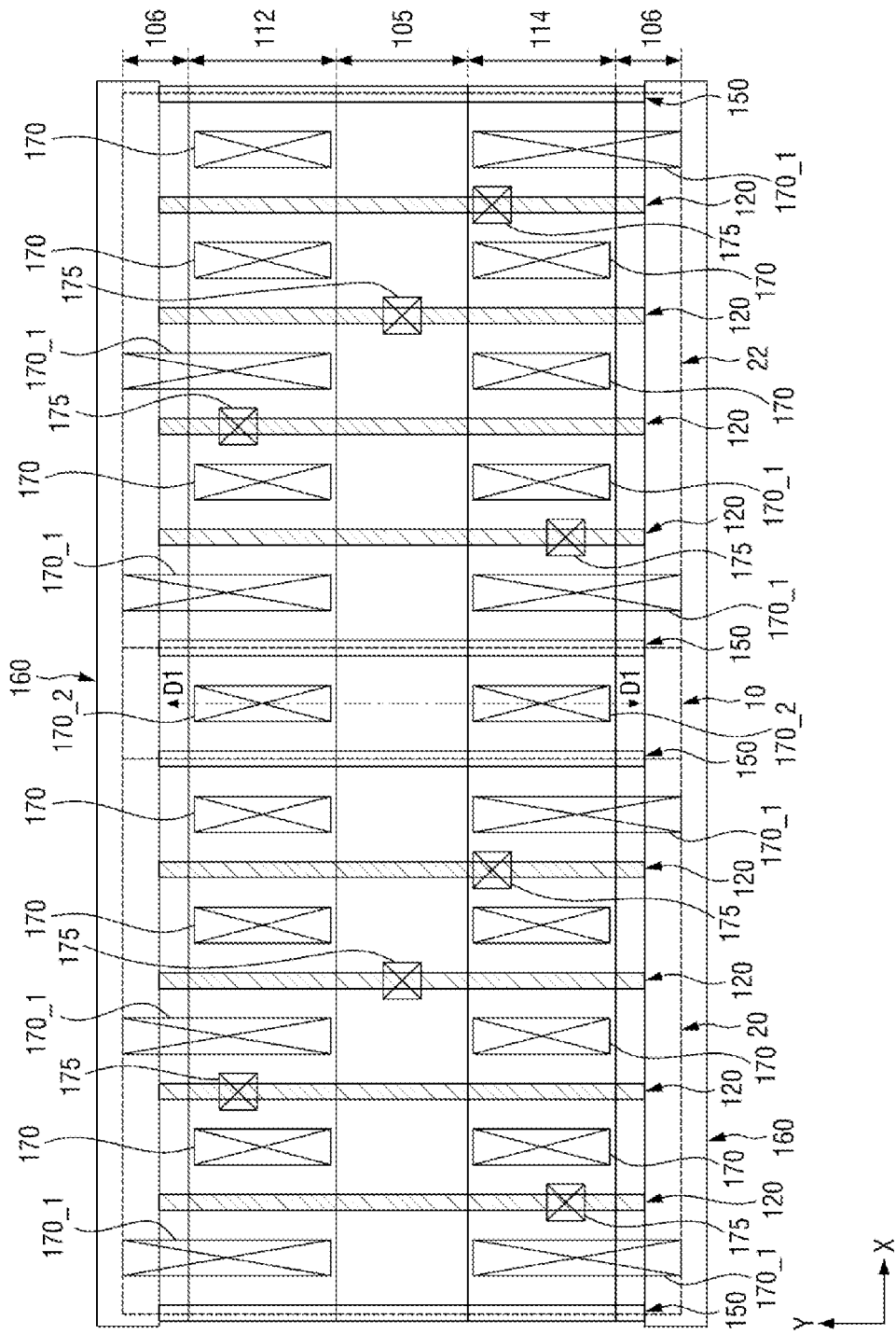
Figure 5B:
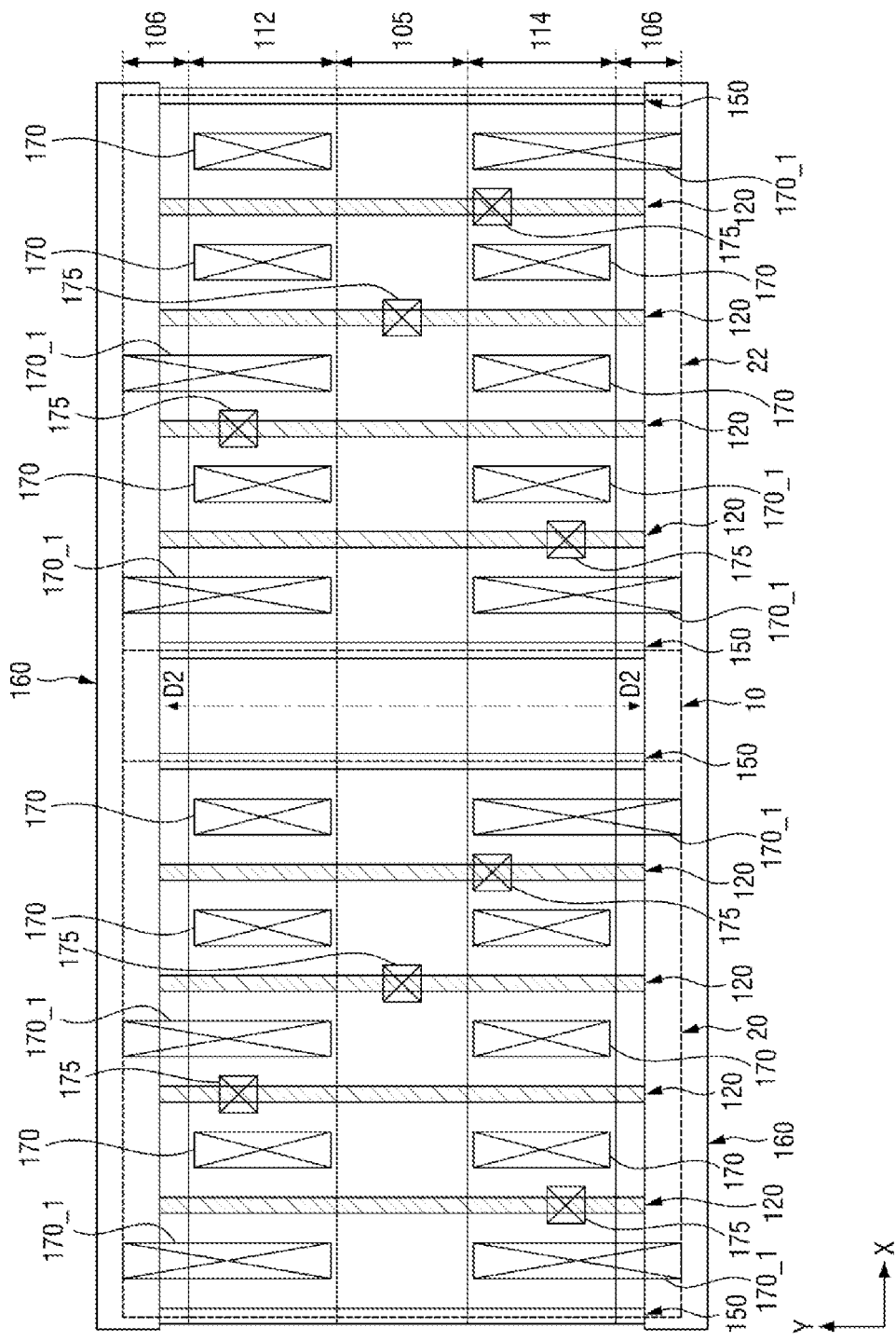
Figure 6A:
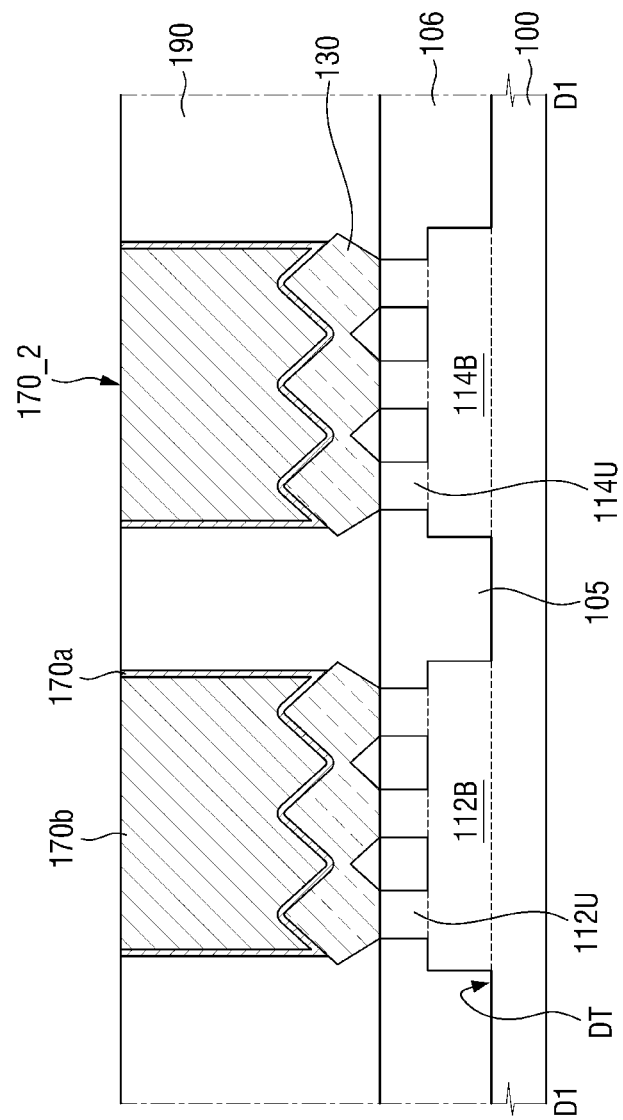
Figure 6B:
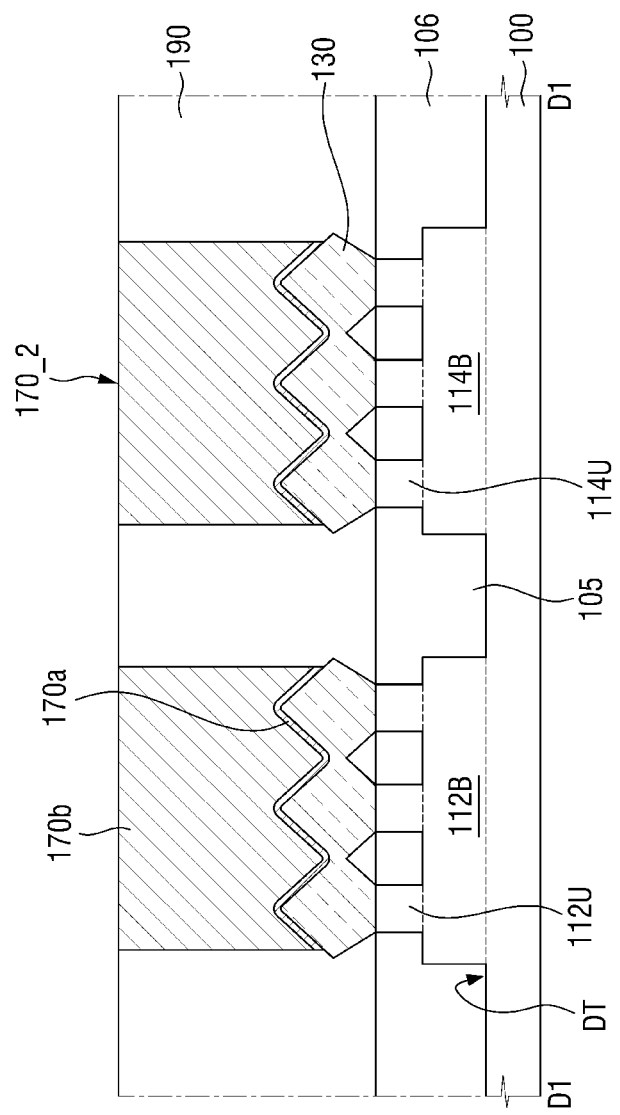
Figure 6C:
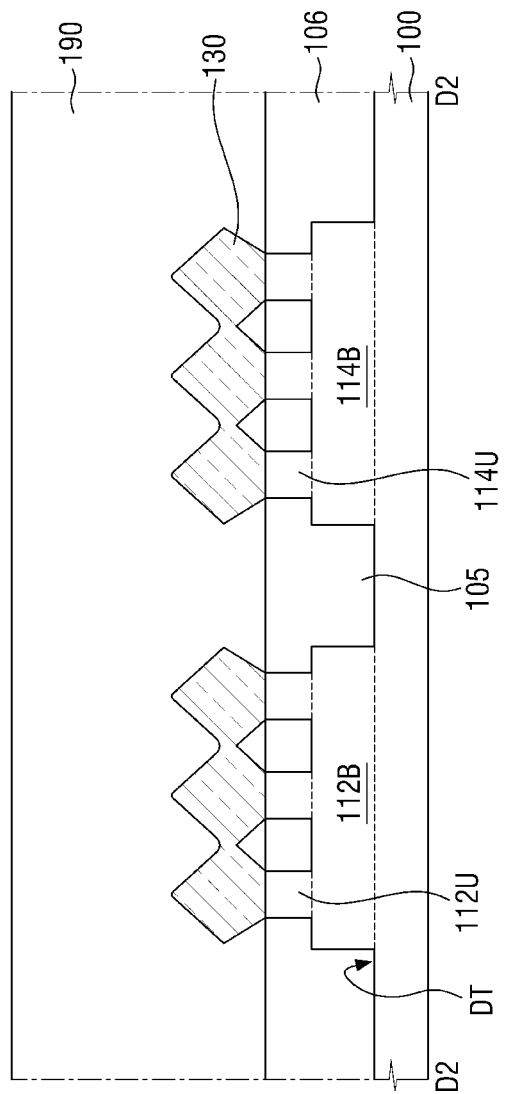
Figure 7A:
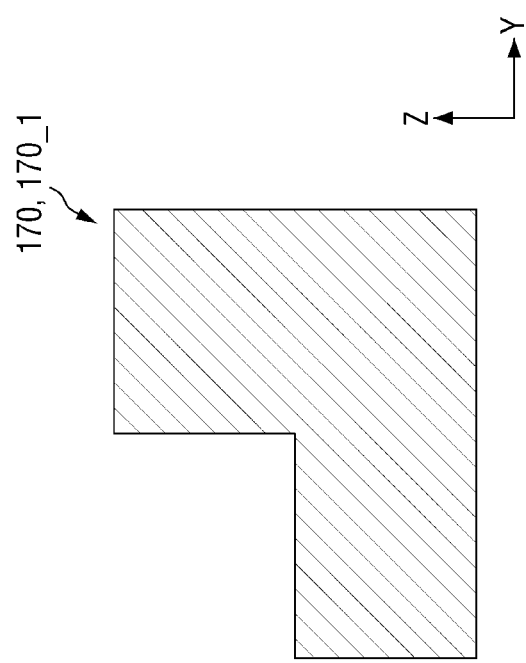
Figure 7B:
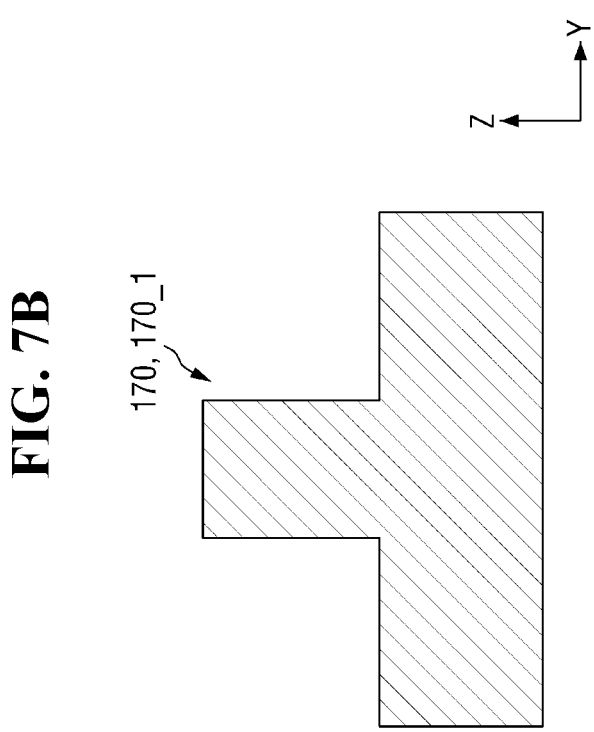
Figure 8:
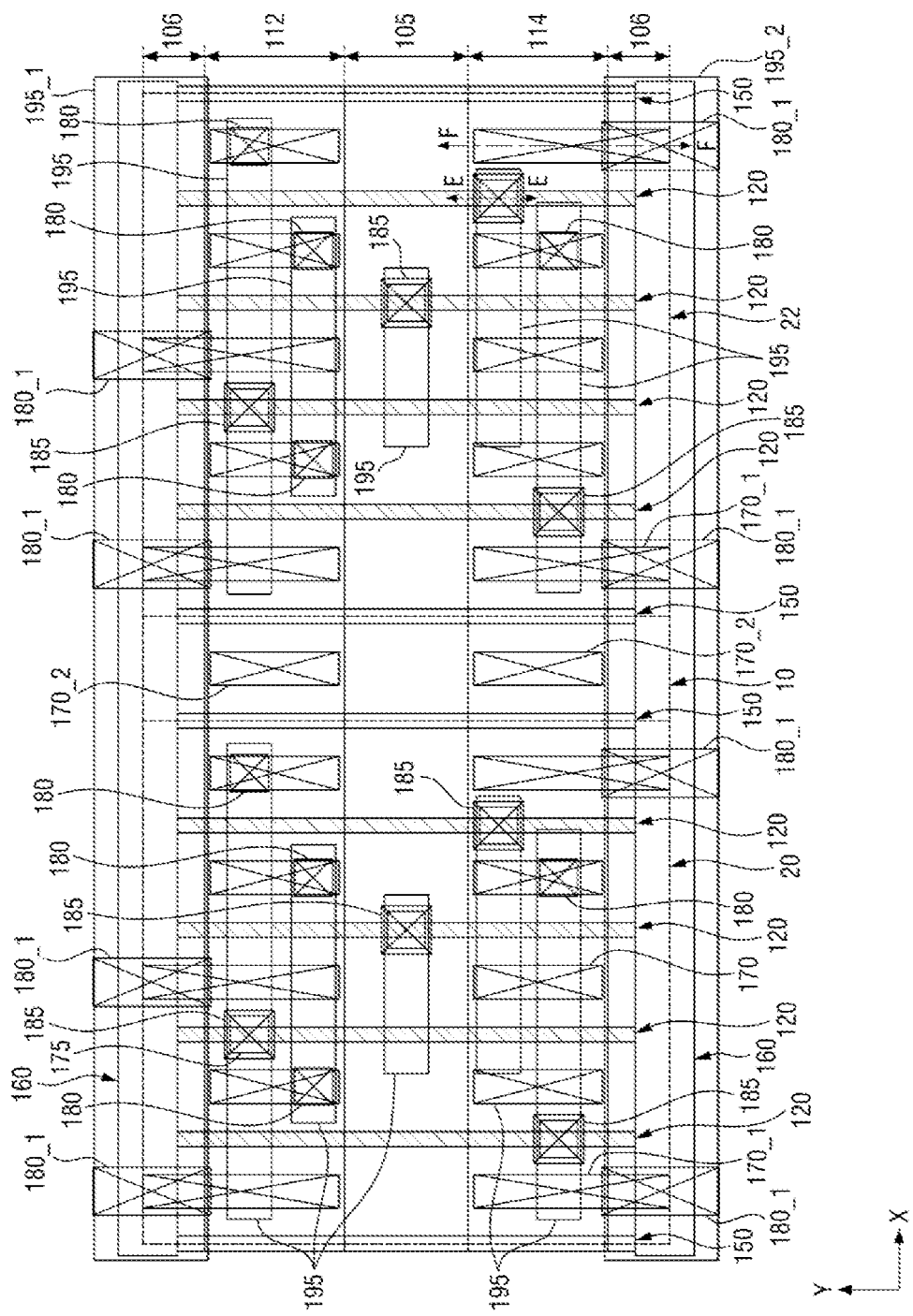
Figure 9:
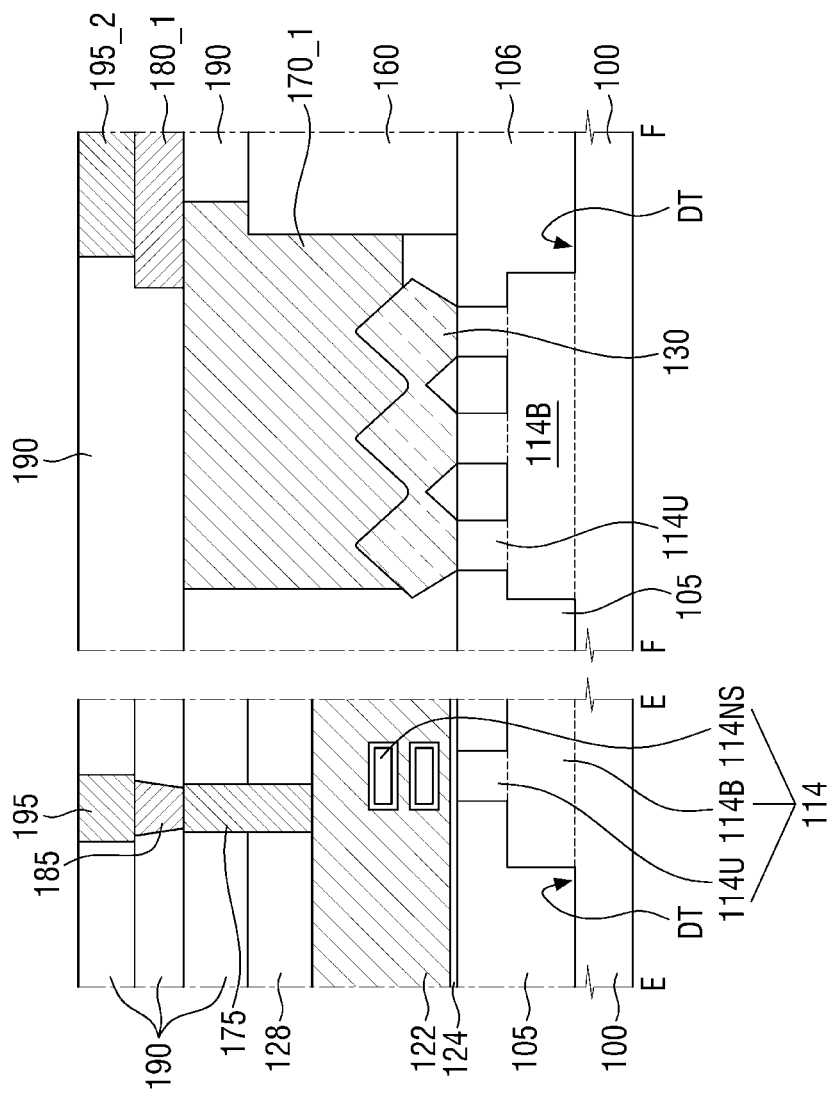
Figure 10A:
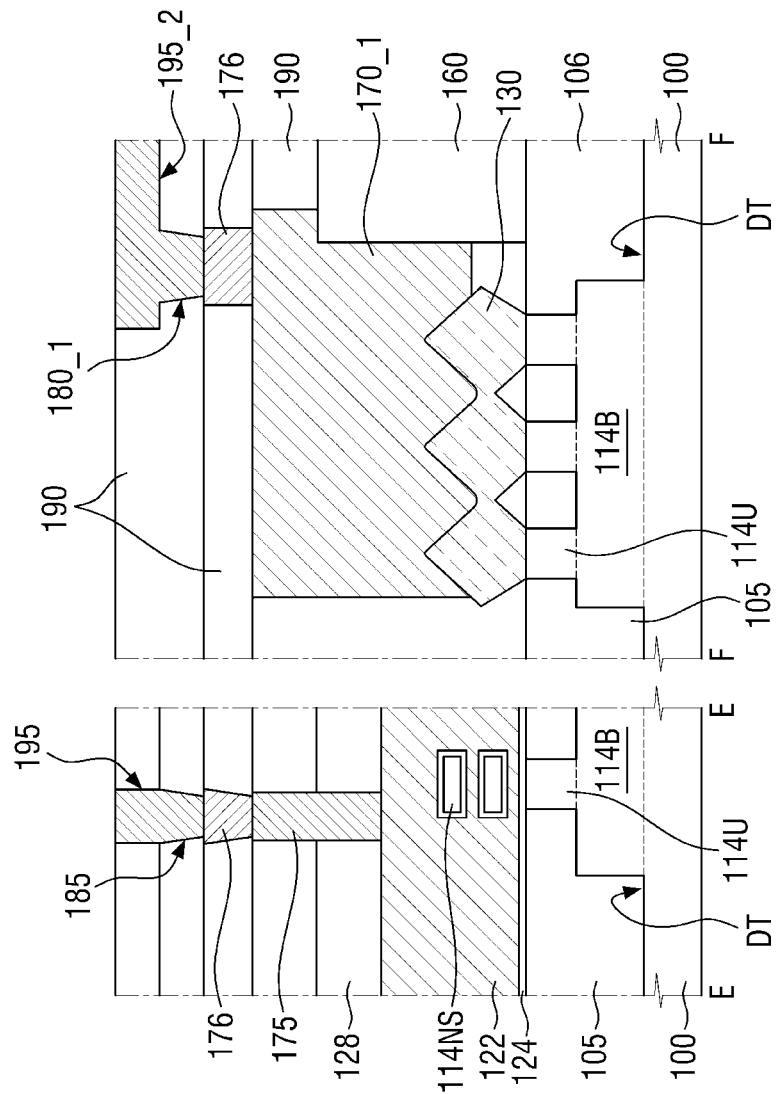
Figure 10B:
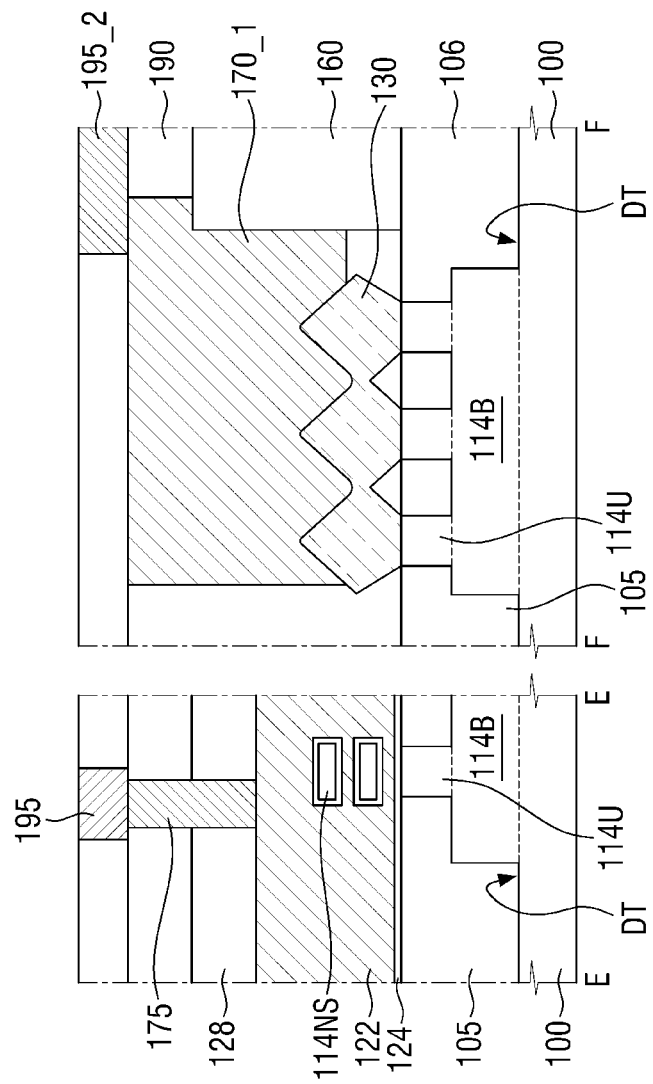

FIG. 1 is a top view of an FEOL (Front-End-Of-Line) of the integrated circuit according to some embodiments. FIG. 2 is a cross-sectional view taken along a line A-A of FIG. 1. FIG. 3 is a cross-sectional view taken along a line B-B. FIGS. 4A and 4B are cross-sectional views taken along a line C-C of FIG. 1, respectively. FIGS. 5A and 5B are top views of the integrated circuit according to some embodiments shown up to a MOL (Middle-Of-Line). FIGS. 6A and 6B are cross-sectional views taken along a line D1-D1 of FIGS. 5A and 5B, respectively. FIG. 6C is a cross-sectional view taken along a line D2-D2 of FIG. 5B. FIGS. 7A and 7B are various views that may be seen by cutting source/drain contacts 170 and 170_1 of FIGS. 5A and 5B in a second direction Y. FIG. 8 is a top view of the integrated circuit according to some embodiments shown up to a BEOL (Back-End-Of-Line). FIG. 9 is a cross-sectional view taken along lines E-E and F-F of FIG. 8. FIGS. 10A and 10B are other exemplary cross-sectional views taken along lines E-E and F-F of FIG. 8.

For reference, in FIGS. 4A and 4B, X-X and Y-Y mean cut directions. FIG. 8 may be a drawing in which a wiring layer is formed on the top view shown in FIG. 5A. Further, FIG. 8 only shows a via connected to the gate contact and the source/drain contact, and a M1 metal layer on the via.

Referring to FIGS. 1 to 10B, an integrated circuit according to some embodiments includes a first standard cell 20, a second standard cell 22, and a first insulating filler cell 10, and a cell gate cutting pattern 160.

In FIGS. 1 to 4, the first standard cell 20, the second standard cell 22, and the first insulating filler cell 10 may be formed on the substrate 100.

The substrate 100 may be a silicon substrate or an SOI (silicon-on-insulator). Alternatively, the substrate 100 may include, but is not limited to, silicon germanium, SGOI (silicon germanium on insulator), indium antimonide, lead tellurium compound, indium arsenide, indium phosphide, gallium arsenide or gallium antimonide.

A first active region 112 may be defined in the first direction X. The first active region 112 may be defined by a deep trench DT. The first active region 112 may be a region in which a p-type transistor is formed. The first active region 112 may include, for example, a well region doped with an n-type impurity.

The first active region 112 may include a first lower active region 112B, a first upper active region 112U, and a first nanosheet 112NS. The first lower active region 112B may have a sidewall defined by the deep trench DT. The first upper active region 112U may have a fin shape protruding from the first lower active region 112B. The first upper active region 112U may have a sidewall defined by a trench that is shallower than the deep trench DT. The first nanosheet 112NS may be disposed to be spaced apart from the first upper active region 112U. Although the two first nanosheets 112NS are shown, this is only for convenience of explanation and the number thereof is not limited thereto.

The second active region 114 may be defined in the first direction X. The second active region 114 may be defined to be spaced apart from the first active region 112 in a second direction Y. The first active region 112 and the second active region 114 may be separated by the deep trench DT. The second active region 114 may be a region in which an n-type transistor is formed. The second active region 114 may include, for example, a well region doped with a p-type impurity.

In FIGS. 1 and 8, the second active region 114 may include a second lower active region 114B, a second upper active region 114U, and a second nanosheet 114NS. The second lower active region 114B may have a sidewall defined by the deep trench DT. The second upper active region 114U may have a fin shape protruding from the second lower active region 114B. The second upper active region 114U may have a sidewall defined by a trench that is shallower than the deep trench DT. The trench may be connected to the deep trench DT. The second nanosheet 114NS may be disposed to be spaced apart from the second upper active region 114U. Although the two second nanosheets 114NS are shown, this is only for convenience of explanation and the number thereof is not limited thereto.

Each of the first standard cell 20, the second standard cell 22, and the first insulating filler cell 10 may include a first active region 112 and a second active region 114.

An active region separation film 105 may be formed on the substrate 100. The active region separation film 105 may cross between the first active region 112 and the second active region 114. The active region separation film 105 may extend in the first direction X between the first active region 112 and the second active region 114. The active region separation film 105 may fill the deep trench DT that separates the first active region 112 and the second active region 114.

The cell separation film 106 may be formed on the substrate 100. The cell separation film 106 may fill the deep trench DT that separates the first active region 112 and the second active region 114. The cell separation film 106 may extend in the first direction X along a boundary of the first standard cell 20, a boundary of the second standard cell 22, and a boundary of the first insulating filler cell 10. Each of the active region separation film 105 and the cell separation film 106 may include an insulating material.

The active region separation film 105 and the cell separation film 106 may include an insulating material which fills the deep trench DT that defines the first active region 112 and the second active region 114. In the following description, the active region separation film 105 may be an insulating material film disposed between the first active region 112 and the second active region 114 included in a single standard cell. For example, the active region separation film 105 will be described as an insulating material film disposed inside the cell. The cell separation film 106 may be an insulating material film which is not disposed inside the cell, but extends along the cell boundary extending in the first direction X among the cell boundaries. For example, the cell separation film 106 will be described as an insulating material film disposed along the cell boundary.

The integrated circuit according to some embodiments may include a plurality of gate stacks 120, and a plurality of insulating gates 150. The gate stacks 120 and the insulating gates 150 may extend in the second direction Y. The gate stacks 120 and the insulating gates 150 may be disposed to be adjacent to each other in the first direction X. The plurality of insulating gates 150 may be also referred to as a plurality of insulating isolations.

The gate stacks 120 and the insulating gates 150 disposed to be adjacent in the first direction X may be spaced apart from each other by 1 CPP (contacted poly pitch). As an example, two adjacent gate stacks 120 may be separated by 1 CPP. As another example, a gate stack 120 and an insulating gate 150 adjacent to each other may be spaced apart from each other by 1 CPP. As another example, two adjacent insulating gates 150 may be spaced apart from each other by 1 CPP.

For example, it is supposed that there are first and second gate stacks adjacent to each other. If a distance between a center line of the first gate stack extending in the second direction Y and a center line of the second gate stack extending in the second direction Y is 1 CPP, it means that no other gate stack or insulating gate is disposed between the first gate stack and the second gate stack.

The gate stack 120 and the insulating gate 150 may be disposed over the first active region 112 and the second active region 114. The gate stack 120 and the insulating gate 150 may extend from the first active region 112 to the second active region 114. The gate stack 120 and the insulating gate 150 may cross the active region separation film 105. A part of the gate stack 120 and a part of the insulating gate 150 may extend to the top of the cell separation film 106.

The gate stack 120 may include a gate electrode 122, a gate insulating film 124, a gate spacer 126, and a gate capping film 128. The present invention is not limited thereto. In an example embodiment, the gate stack 120 may not include the gate capping film 128. The gate spacer 126 may define a gate trench in which the gate insulating film 124 and the gate electrode 122 may be formed. The gate spacer 126 may include, for example, an insulating material. The gate insulating film 124 may be formed along the periphery of the first nanosheet 112NS. Although it is not shown, the gate insulating film 124 may be formed along the periphery of the second nanosheet (114NS of FIG. 8). The gate insulating film 124 may include, for example, at least one of silicon oxide or a high-dielectric constant material. The high-dielectric constant material may be, for example, a material having a dielectric constant greater than silicon oxide. The gate electrode 122 may be formed on the gate insulating film 124. The gate electrode 122 may wrap around the first nanosheet 112NS. Although it is not shown, the gate electrode 122 may wrap around the second nanosheet (114NS of FIG. 8). The gate electrode 122 may include, for example, at least one of metal (it is meant to include a metal alloy including two or more metals), metal nitride, metal carbide, metal silicide, and a semiconductor material. The gate capping film 128 may be disposed on the gate electrode 122. The gate capping film 128 may include, for example, an insulating material.

The insulating gate 150 may separate at least a part of the first active region 112 from at least a part of the second active region 114. The insulating gate 150 may separate the first upper active region 112U of the first active region 112. Although the insulating gate 150 is shown to separate a part of the first lower active region 112B in the first active region 112, the embodiment is not limited thereto. The insulating gate 150 may totally separate the first lower active region 112B for electrical separation of the adjacent elements. Although it is not shown, the insulating gate 150 may separate the second upper active region 114U in the second active region 114 and may separate a part of the second lower active region 114B. Considering a fabricating process for forming the insulating gate 150, after removing at least a part of the first active region 112 and at least a part of the second active region 114, an insulating material is filled in the portions from which the first active region 112 and the second active region 114 are removed. Therefore, the insulating gate 150 may be formed. Accordingly, a part of the sidewall of the insulating gate 150 may be in contact with the first active region 112 and the second active region 114. A part of the sidewall of the insulating gate 150 may be in contact with the semiconductor material film included in the first active region 112 and the second active region 114. The term "contact," as used herein, refers to a direct connection (i.e., touching) unless the context indicates otherwise.

The insulating gate 150 may cross the active region separation film 105. The insulating gate 150 may be disposed on the active region separation film 105. A part of the insulating gate 150 may enter the active region separation film 105. In the process of forming the insulating gate 150, a part of the active region separation film 105 may be removed. Therefore, a part of the insulating gate 150 may enter the active region separation film 105. The gate spacer 126 may be disposed on the sidewall of the insulating gate 150. The insulating gate 150 may include, for example, an insulating material. Although the insulating gate 150 is shown as a single film, the embodiment is not limited thereto.

In the integrated circuit according to some embodiments, at least a part of the insulating gate 150, extending in the second direction Y, may be disposed at a boundary between two adjacent standard cells and separate the two adjacent standard cells. The insulating gate 150 may be placed not only in the boundary of the standard cells, but also inside the standard cells. However, hereinafter, the insulating gate 150 will be described as being disposed at the boundary of the standard cells extending in the second direction Y.

The semiconductor pattern 130 may be formed between the gate stack 120 and the insulating gate 150 adjacent to each other. The semiconductor pattern 130 may be formed by removing some of the active regions 112 and 114 to form a recess and then filling the recess through an epitaxial growth process. The semiconductor pattern 130 may be formed on the first active region 112. In FIGS. 6A and 6B, the semiconductor pattern 130 may be formed on the first active region 112 and the second active region 114. At least a part of the semiconductor pattern 130 may be included in a source/drain region of the transistor. The semiconductor pattern 130 formed on the first active region 112 may be doped with impurities of conductivity type different from that of the semiconductor pattern 130 formed on the second active region 114. The semiconductor pattern 130 may also be formed between the insulating gates 150 adjacent to each other.

The cell gate cutting pattern 160 may be disposed on the cell separation film 106. The cell gate cutting pattern 160 may extend in the first direction X. The cell gate cutting pattern 160 may extend in the first direction X along the boundary of the first standard cell 20, the boundary of the first insulating filler cell 10, and the boundary of the second standard cell 22. The gate stack 120 and the insulating gate 150 may be disposed between the cell gate cutting patterns 160 spaced apart from each other in the second direction Y. The cell gate cutting pattern 160 may include, for example, an insulating material.

The cell gate cutting pattern 160 may cut the gate stack 120 or the insulating gate 150 at the boundary of the cells. The cell gate cutting pattern 160 may be in contact with the gate stack 120 and the insulating gate 150. The cell gate cutting pattern 160 may be in contact with a short side of the gate stack 120 and a short side of the insulating gate 150 extending in the first direction X. The first standard cell 20, the first insulating filler cell 10, and the second standard cell 22 may further include the cell gate cutting pattern 160 formed along a boundary extending in the first direction X.

In FIG. 4A, the gate insulating film 124 may not be formed on the sidewall of the cell gate cutting pattern 160. The present invention is not limited thereto. In an example embodiment as shown in FIG. 4B, the gate insulating film 124 may extend along the sidewall of the cell gate cutting pattern 160. Such a difference may vary depending on which stage the cell gate cutting pattern 160 is formed. When the cell gate cutting pattern 160 is formed after the gate electrode 122 is formed, the gate insulating film 124 may not be formed on the sidewall of the cell gate cutting pattern 160 as shown in FIG. 4A. On the other hand, when the cell gate cutting pattern 160 is formed before the gate electrode 122 is made (a mold gate stage for forming the gate electrode 122), as shown in FIG. 4B, the gate insulating film 124 may extend along the sidewall of the cell gate cutting pattern 160.

The first insulating filler cell 10 may be disposed between the first standard cell 20 and the second standard cell 22. The first standard cell 20 and the second standard cell 22 may be disposed to be adjacent to each other in the first direction X with the first insulating filler cell 10 interposed therebetween. The boundary between the first insulating filler cell 10 and the first standard cell 20 extends in the second direction Y, and the boundary between the first insulating filler cell 10 and the second standard cell 22 extends in the second direction Y.

The first insulating filler cell 10 may include two insulating gates 150 which cross the first active region 112 and the second active region 114 and are adjacent to each other in the first direction X. Each insulating gate 150 may be located at a boundary extending in the second direction Y of the first insulating filler cell 10.

The first insulating filler cell 10 may have a one-pitch dimension in the first direction X. The one-pitch dimension may be 1 CPP (contacted poly pitch). For example, when the first insulating filler cell 10 has a first filler cell boundary and a second filler cell boundary extending in the second direction Y, the first insulating filler cell 10 may extend, in the first direction X, over the one-pitch dimension from the first filler cell boundary to the second filler cell boundary.

For the convenience of description, the first standard cell 20 may have a width of 5 CPP in the first direction X. The first standard cell 20 may be defined by two insulating gates 150 spaced apart from each other at a distance of 5 CPP. Four gate stacks 120 may be disposed in the first standard cell 20. For example, the four gate stacks 120 may be disposed between the two insulating gates 150 defining the first standard cell 20 in the first direction X. The first standard cell 20 may form a boundary with the first insulating filler cell 10. The first insulating filler cell 10 may form a boundary with the first standard cell 20 in one of the two insulating gates 150 of the first insulating filler cell 10. The first standard cell 20 and the first insulating filler cell 10 adjacent to each other may share the insulating gate 150 at a common boundary. The first standard cell 20 may further include an insulating gate 150 spaced 5 CPP apart from the one of the two insulating gates 150 and located at a boundary different from the first insulating filler cell 10. The first standard cell 20 may include one or more (e.g., four) gate stacks 120 disposed between the insulating gates 150 located at the boundary of the first standard cell 20. In FIG. 1, the first standard cell 20 may have a width of 5 CPP.

The second standard cell 22 may form a boundary with the first insulating filler cell 10. The first insulating filler cell 10 may form a boundary with the second standard cell 22 in the other of the two insulating gates 150 of the first insulating filler cell 10. The second standard cell 22 and the first insulating filler cell 10 adjacent to each other may share the insulating gate 150 at a common boundary. The second standard cell 22 may further include an insulating gate 150 spaced 5 CPP apart from the other of the two insulating gates 150 and located at a boundary different from the first insulating filler cell 10. The second standard cell 22 may include one or more (e.g., four) gate stacks 120 disposed between the insulating gates 150 located at the boundary of the second standard cell 22. In FIG. 1, the second standard cell 22 may have a width of 5 CPP.

The first standard cell 20 may further include a first portion of a first active region 112 and a first portion of a second active region 114. The gate stack 120 included in the first standard cell 20 may intersect the first portion of the first active region 112 and the first portion of the second active region 114. The first standard cell 20 may include integrated first p-type transistors 132 and first n-type transistors 134. In an example embodiment, the first p-type transistors 132 and the first n-type transistors 134 may be connected to each other to implement an intended function of the first standard cell 20. The first p-type transistors 132 may be formed at a position where the gate stack 120 and the first portion of the first active region 112 intersect each other, and the first n-type transistors 134 may be formed at a position where the gate stack 120 and the first portion of the second active region 114 intersect each other. For example, each of the first p-type transistors 132 may include a gate electrode 122, a first nanosheet 112NS that is a channel region, and a semiconductor pattern 130 that is a source/drain region.

The second standard cell 22 may further include a second portion of the first active region 112 and a second portion of the second active region 114. The gate stack 120 included in the second standard cell 22 may intersect the second portion of the first active region 112 and the second portion of the second active region 114. The second standard cell 22 may include integrated second p-type transistors 136 and second n-type transistors 138. The second p-type transistors 136 may be formed at a position where the gate stack 120 and the second portion of the first active region 112 intersect each other, and the second n-type transistors 138 may be formed at a position where the gate stack 120 and the second portion of the second active region 114 intersect with each other. For example, each of the second p-type transistors 136 may include a gate electrode 122, a first nanosheet 112NS that is a channel region, and a semiconductor pattern 130 that is a source/drain region.

The first p-type transistor 132 and the second p-type transistor 136 are formed on the first portion of the first active region 112 and the second portion thereof respectively, and the first n-type transistor 134 and the second n-type transistor 138 are formed on the first portion of the second active region 114 and the second portion thereof, respectively.

The first insulating filler cell 10 disposed between the first standard cell 20 and the second standard cell 22 includes the two insulating gates 150 spaced 1 CPP, for example, apart from each other. Since each insulating gate 150 separates at least some of the first active region 112 and the second active region 114, the first active region 112 and the second active region 114 may be divided into at least three portions in the first direction X, respectively. For example, at least three portions of the first active region 112 may include a third portion disposed in the first insulating filler cell 10, in addition to the first and second portions of the first active region 112. Similarly, at least three portions of the second active region 114 may include a third portion disposed in the first insulating filler cell 10, in addition to the first and second portions of the second active region 114. The semiconductor pattern 130 may be disposed between the two insulating gates 150 included in the first insulating filler cell 10. In the first insulating filler cell 10, the semiconductor pattern 130 may be disposed in the first active region 112 and the second active region 114 between the two insulating gates 150 of the first insulating filler cell 10.

The first standard cell 20, the second standard cell 22, and the first insulating filler cell 10 may further include a cell gate cutting pattern 160. The cell gate cutting pattern 160 may extend along the boundary, extending in the first direction X, of the first standard cell 20, the boundary, extending in the first direction X, of the first insulating filler cell 10 and the boundary, extending in the first direction X, of the second standard cell 22. The cell gate cutting pattern 160 may be in contact with the gate stack 120 included in the first standard cell 20, the gate stack 120 included in the second standard cell 22, and the insulating gate 150 included in the first insulating filler cell 10. In an example embodiment, the cell gate cutting pattern 160 may include an upper cell gate cutting pattern and a lower cell gate cutting pattern spaced apart from each other in the second direction Y. The upper cell gate cutting pattern may be in contact with a first side of the first standard cell 20, and the lower cell gate cutting pattern may be in contact with a second side, opposite to the first side in the second direction Y, of the first standard cell 20. The upper cell gate cutting pattern may be in contact with a first side of the second standard cell 22, and the lower cell gate cutting pattern may be in contact with a second side, opposite to the first side in the second direction Y, of the second standard cell 22. The upper cell gate cutting pattern may be in contact with a first side of the first insulating filler cell 10, and the lower cell gate cutting pattern may be in contact with a second side, opposite to the first side in the second direction Y, of the first insulating filler cell 10.

In FIGS. 5A to 7B, an integrated circuit according to some embodiments may include source/drain contacts 170, 170_1 and 170_2 and a gate contact 175.

The source/drain contacts 170, 170_1 and 170_2 may be disposed on the first active region 112 and the second active region 114. The source/drain contacts 170, 170_1 and 170_2 may be connected to the semiconductor pattern 130 formed on the first active region 112 and the second active region 114. The source/drain contacts 170, 170_1 and 170_2 may include a normal source/drain contact 170, an extended source/drain contact 170_1, and a filler source/drain contact 170_2. The normal source/drain contact 170 may generally overlap the first active region 112 or the second active region 114. For example, the normal source/drain contact 170 may refer to a source/drain contact in the first active region 112 or a source/drain contact in the second active region 114. A part of the extended source/drain contact 170_1 may extend to the top of the cell separation film 106 and the cell gate cutting pattern 160. The extended source/drain contact 170_1 may be connected to power rails (195_1 and 195_2 of FIG. 8) to be described later. The filler source/drain contact 170_2 may be disposed between the insulating gates 150 of the first insulating filler cell 10. The filler source/drain contact 170_2 may not be electrically connected to a wiring layer formed at a level higher than the filler source/drain contact 170_2.

The gate contact 175 is formed on the gate stack 120 but is not formed on the insulating gate 150. The gate contact 175 may be connected to the gate stack 120. For example, the gate contact 175 may be electrically connected to the gate electrode 122 of the gate stack 120.

The gate contact 175 may be disposed on the first active region 112, the second active region 114, or the active region separation film 105. In the integrated circuit according to some embodiments, some gate contacts 175 may be disposed on the first active region 112, and some gate contacts 175 may be disposed on the second active region 114.

Each of the first standard cell 20 and the second standard cell 22 may include the normal source/drain contact 170, the extended source/drain contact 170_1, and the gate contact 175.

In FIGS. 5A, 6A and 6B, the first insulating filler cell 10 may include a filler source/drain contact 170_2. In FIGS. 5B and 6C, the first insulating filler cell 10 does not include the filler source/drain contact 170_2.

In FIG. 6A, the filler source/drain contact 170_2 may include a contact barrier film 170*a* and a contact filling film 170*b*. The contact filling film 170*b* may fill a trench defined by the contact barrier film 170*a*. On the other hand, in FIG. 6B, the contact barrier film 170*a* may be formed only between the semiconductor pattern 130 and the contact filling film 170*b*, but may not be formed between an interlayer insulating film 190 and the contact filling film 170*b*. The normal source/drain contact 170 and the extended source/drain contact 170_1 may also have a shape as shown in FIGS. 6A and 6B. In the subsequent drawings, the contact barrier film 170*a* and the contact filling film 170*b* are shown as one film without distinction.

FIGS. 7A and 7B show exemplary cross-sections of the source/drain contacts 170 and 170_1. FIGS. 7A and 7B may be cross-sectional views taken in the second direction Y. As the gate contact 175 is disposed in the first active region 112 or the second active region 114, a tight margin between the gate contact 175 and the source/drain contacts 170 and 170_1 should be taken into account. For example, depending on whether the gate contact 175 is located around the source/drain contacts 170 and 170_1, the cross-sections of the source/drain contacts 170 and 170_1 may haves an L shape (FIG. 7A) or may have an upside-down T-shape (FIG. 7B). If the gate contact 175 is not disposed around the source/drain contacts 170 and 170_1, the source/drain contacts 170 and 170_1 may have a cross-section as shown in FIGS. 6A and 6B.

In FIGS. 8 to 10B, the integrated circuit according to some embodiments may include source/drain vias 180 and 180_1, a gate via 185, a wiring pattern 195, and power rails 195_1 and 195_2. Each of the first standard cell 20 and the second standard cell 22 may include the source/drain vias 180 and 180_1, the gate via 185, the wiring pattern 195, and the power rails 195_1 and 195_2.

The gate via 185 may be formed on the gate contact 175. The gate via 185 may connect the gate contact 175 and the wiring pattern 195. The source/drain vias 180 and 180_1 may be formed on the source/drain contacts 170 and 170_1. The source/drain vias 180 and 180_1 may be connected to at least some of the source/drain contacts 170 and 170_1. The source/drain vias 180 and 180_1 may include a normal via 180 which connects the normal source/drain contact 170 and the wiring pattern 195, and a power rail via 180_1 which connects the extended source/drain contact 170_1 and the power rails 195_1 and 195_2. The power rail via 180_1 may overlap a portion of the extended source/drain contact 170_1, extending in the second direction Y further from the extended source/drain contact 170_1 over the power rails 195_1 and 195_2.

The wiring pattern 195 and the power rails 195_1 and 195_2 may extend in the first direction X. The power rails 195_1 and 195_2 may include an upper power rail 195_1 to which a first voltage is supplied, and a lower power rail 195_2 to which a second voltage is supplied. The upper power rail 195_1 may supply power to the p-type transistor, and the lower power rail 195_2 may supply power to the n-type transistor.

A structure that connects the gate contact 175 and the wiring pattern 195, the source/drain contacts 170 and 170_1, the wiring pattern 195, and the power rails 195_1 and 195_2 may not have the structure as shown in FIG. 9.

In FIG. 10A, a middle contact 176 may be interposed between the source/drain vias 180 and 180_1 and the source/drain contacts 170 and 170_1. The middle contact 176 may also be interposed between the gate via 185 and the gate contact 175. Although the wiring pattern 195 and the gate via 185 are shown as having an integrated structure, the invention is not limited thereto. The wiring pattern 195 and the gate via 185 may be divided by a barrier film.

In FIG. 10B, the source/drain contacts 170 and 170_1 may be connected to the wiring pattern 195 and the power rails 195_1 and 195_2 without the source/drain vias 180 and 180_1. The gate contact 175 may be connected to the wiring pattern 195 without the gate via 185.

Figure 11:
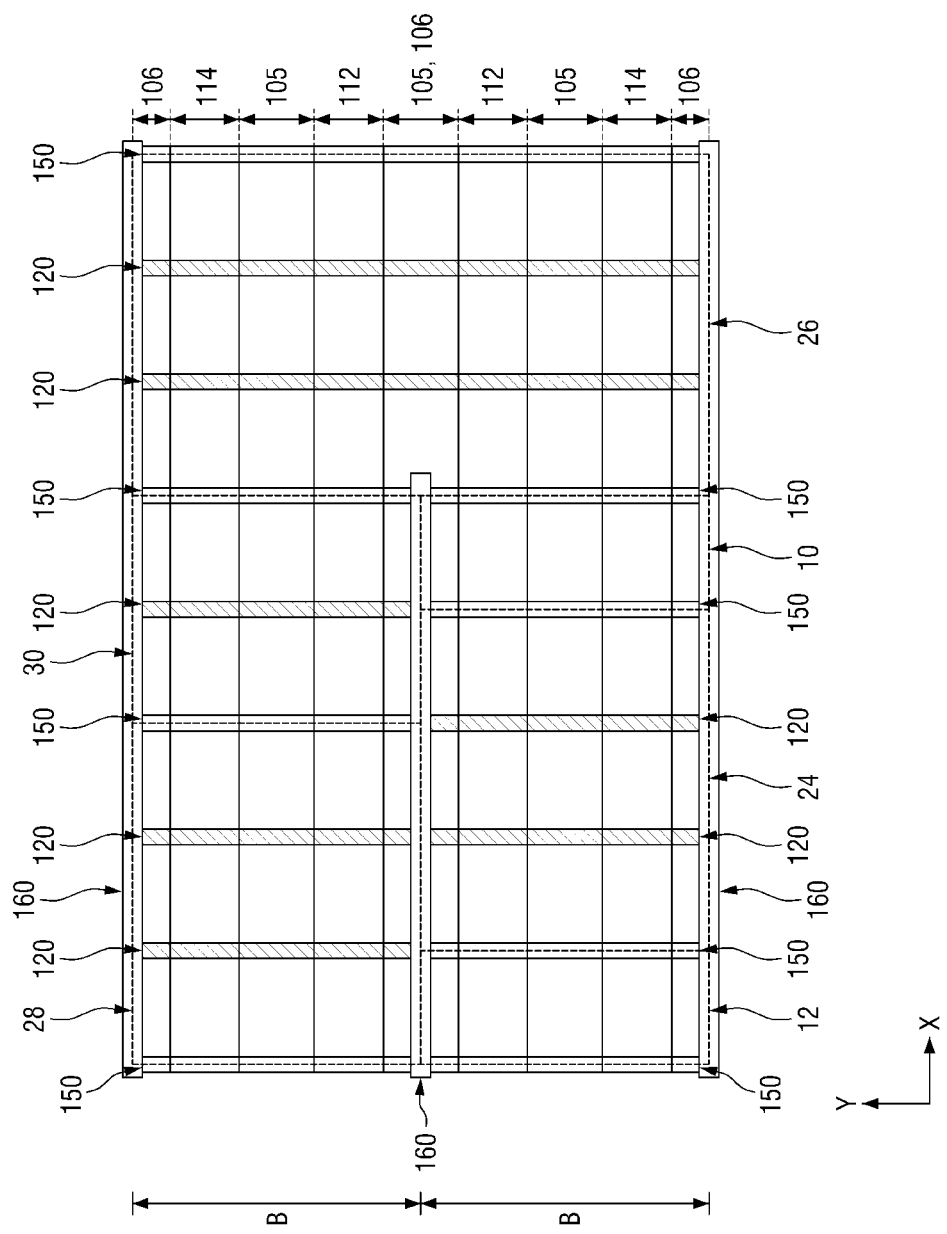
FIG. 11 is a top view for explaining the integrated circuit according to some embodiments.

FIG. 11 is a top view for explaining the integrated circuit according to some embodiments. In the following description and drawings, only the gate stack 120, the insulating gate 150, the first active region 112, the second active region 114, and the cell gate cutting pattern 160 will be explained. Also, repeated contents of parts explained using FIGS. 1 to 10B will be simplified or omitted.

Referring to FIG. 11, the integrated circuit according to some embodiments may include a first insulating filler cell 10, a second insulating filler cell 12, a third standard cell 24, a fourth standard cell 26, a fifth standard cell 28, and a sixth standard cell 30.

The first insulating filler cell 10 and the second insulating filler cell 12 may have a width of 1 CPP in the first direction X. The third standard cell 24, the fourth standard cell 26, and the fifth standard cell 28 may have a width of 3 CPP in the first direction X. The sixth standard cell 30 may have a width of 2 CPP in the first direction X. When the first insulating filler cell 10, the second insulating filler cell 12, the third standard cell 24, the fifth standard cell 28, and the sixth standard cell 30 have a height of B in the second direction Y, the fourth standard cell 26 may have a height of 2B.

Each of the first insulating filler cell 10, the second insulating filler cell 12, the third standard cell 24, the fourth standard cell 26, the fifth standard cell 28 and the sixth standard cell 30 may include an insulating gate 150 located on the boundary.

Each of the first insulating filler cell 10 and the second insulating filler cell 12 includes two insulating gates 150. The third standard cell 24 may be disposed between the first insulating filler cell 10 and the second insulating filler cell 12. The third standard cell 24 may be adjacent to the first insulating filler cell 10 and the second insulating filler cell 12 in the first direction X. The third standard cell 24 may form a first boundary with the first insulating filler cell 10 in one insulating gate 150 of the first insulating filler cell 10, and may form a second boundary, opposite to the first boundary in the first direction X, with the second insulating filler cell 12 in one insulating gate 150 of the second insulating filler cell 12.

The sixth standard cell 30 may be adjacent to the first insulating filler cell 10 in the second direction Y. The fifth standard cell 28 may be adjacent to the sixth standard cell 30 in the first direction X. The fifth standard cell 28 may be adjacent to the second insulating filler cell 12 in the second direction Y. The fifth standard cell 28 may form a boundary with the sixth standard cell 30. The insulating gate 150 may be located at a boundary between the fifth standard cell 28 and the sixth standard cell 30. For example, the fifth standard cell 28 and the sixth standard cell 30 may share the insulating gate 150 at a common boundary.

The gate stack 120 included in the sixth standard cell 30 may be aligned, in the second direction Y, with one of the two insulating gates 150 of the first insulating filler cell 10 which forms a boundary with the third standard cell 24. One of two gate stacks 120 of the fifth standard cell 28 may be aligned, in the second direction Y, with one of two insulating gates 150 of the second insulating filler cell 12 which forms a boundary with the third standard cell 24.

The cell gate cutting pattern 160 may be disposed between the third standard cell 24 and the fifth standard cell 28, and between the third standard cell 24 and the sixth standard cell 30. The cell gate cutting pattern 160 may be in contact with the insulating gate 150 and/or the gate stack 120 included in the first insulating filler cell 10, the second insulating filler cell 12, the third standard cell 24, the fifth standard cell 28 and the sixth standard cell 30. For example, the first insulating filler cell 10 may form a boundary with the sixth standard cell 30 in the cell gate cutting pattern 160.

The fourth standard cell 26 may form a boundary with the first insulating filler cell 10 in the insulating gate 150 of the first insulating filler cell 10. Further, the fourth standard cell 26 may form a boundary with the sixth standard cell 30. The insulating gate 150 included in the fourth standard cell 26 may be located at a boundary between the fourth standard cell 26 and the sixth standard cell 30. The insulating gate 150 located at the boundary between the first insulating filler cell 10 and the fourth standard cell 26 may be spaced apart in the second direction Y from the insulating gate 150 located between the fourth standard cell 26 and the sixth standard cell 30. The insulating gate 150 located at the boundary between the first insulating filler cell 10 and the fourth standard cell 26 may be aligned, in the second direction Y, with the insulating gate 150 located at the boundary between the fourth standard cell 26 and the sixth standard cell 30. The insulating gate 150 located at the boundary between the first insulating filler cell 10 and the fourth standard cell 26 may be separated from the insulating gate 150 located at the boundary between the fourth standard cell 26 and the sixth standard cell 30, by the cell gate cutting pattern 160.

Since the fourth standard cell 26 forms the boundary with the first insulating filler cell 10 and the sixth standard cell 30, the height of the fourth standard cell 26 in the second direction Y may be the sum of the height of the first insulating filler cell 10 in the second direction Y and the height of the sixth standard cell 30 in the second direction Y.

In addition, the sum of the width of the first insulating filler cell 10 in the first direction X, the width of the third standard cell 24 in the first direction X, and the width of the second insulating filler cell 12 in the first direction X may be the same as the sum of the width of the fifth standard cell 28 in the first direction X and the width of the sixth standard cell 30 in the first direction X. For example, the density of the integrated circuit layout can be improved by appropriately using the insulating filler cells 10 and 12 having a width of 1 CPP.

The cell gate cutting pattern 160 disposed between the third standard cell 24 and the fifth standard cell 28, and between the third standard cell 24 and the sixth standard cell 30 may not extend to the inside of the fourth standard cell 26.

The third standard cell 24, the fourth standard cell 26, the fifth standard cell 28, and the sixth standard cell 30 may include a p-type transistor and an n-type transistor formed on the first active region 112 and the second active region 114, respectively.

The widths in the first direction X and the heights in the second direction Y of the third standard cell 24, the fourth standard cell 26, the fifth standard cell 28, and the sixth standard cell 30 described above are exemplary, and therefore are not limited thereto. In an example embodiment, the standard cells and the insulating filler cell having the width in the first direction X and the height in the second direction Y different from those described above are combined to allow the integrated circuit layout to have a square or rectangular shape.

Figure 12:
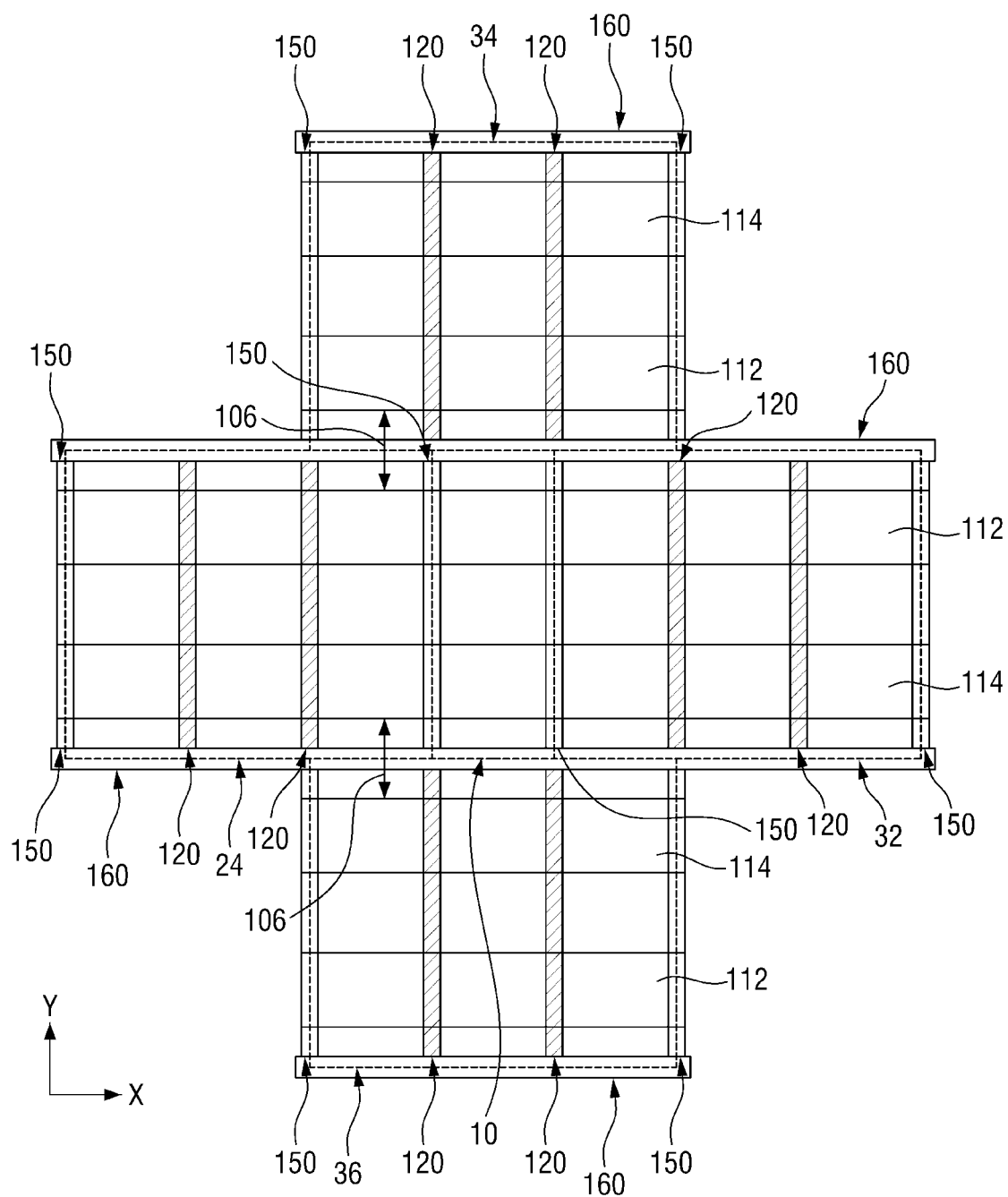
FIG. 12 is a top view for explaining the integrated circuit according to some embodiments.
Figure 13:
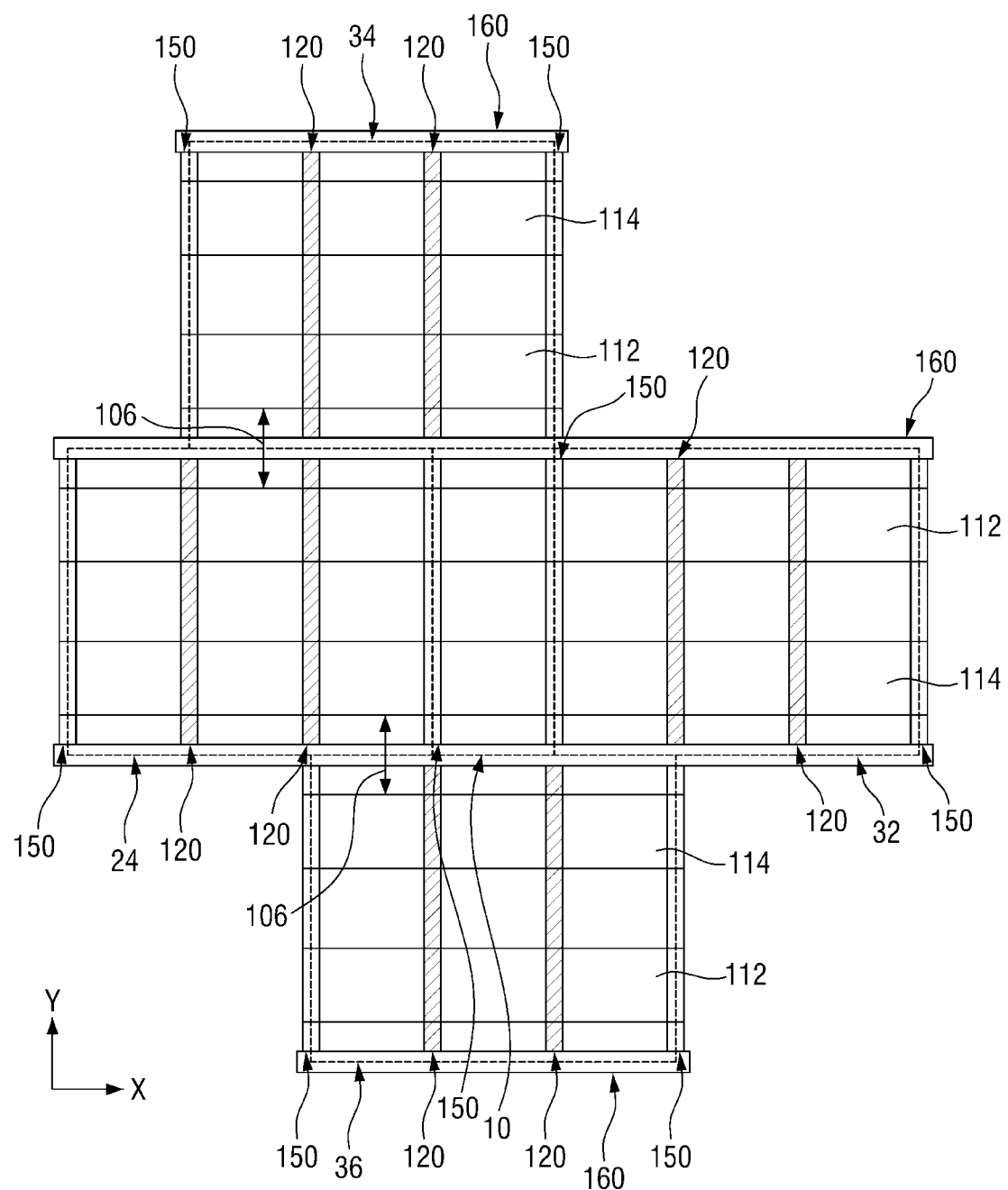
FIG. 13 is a top view for explaining the integrated circuit according to some embodiments.
Figure 14:
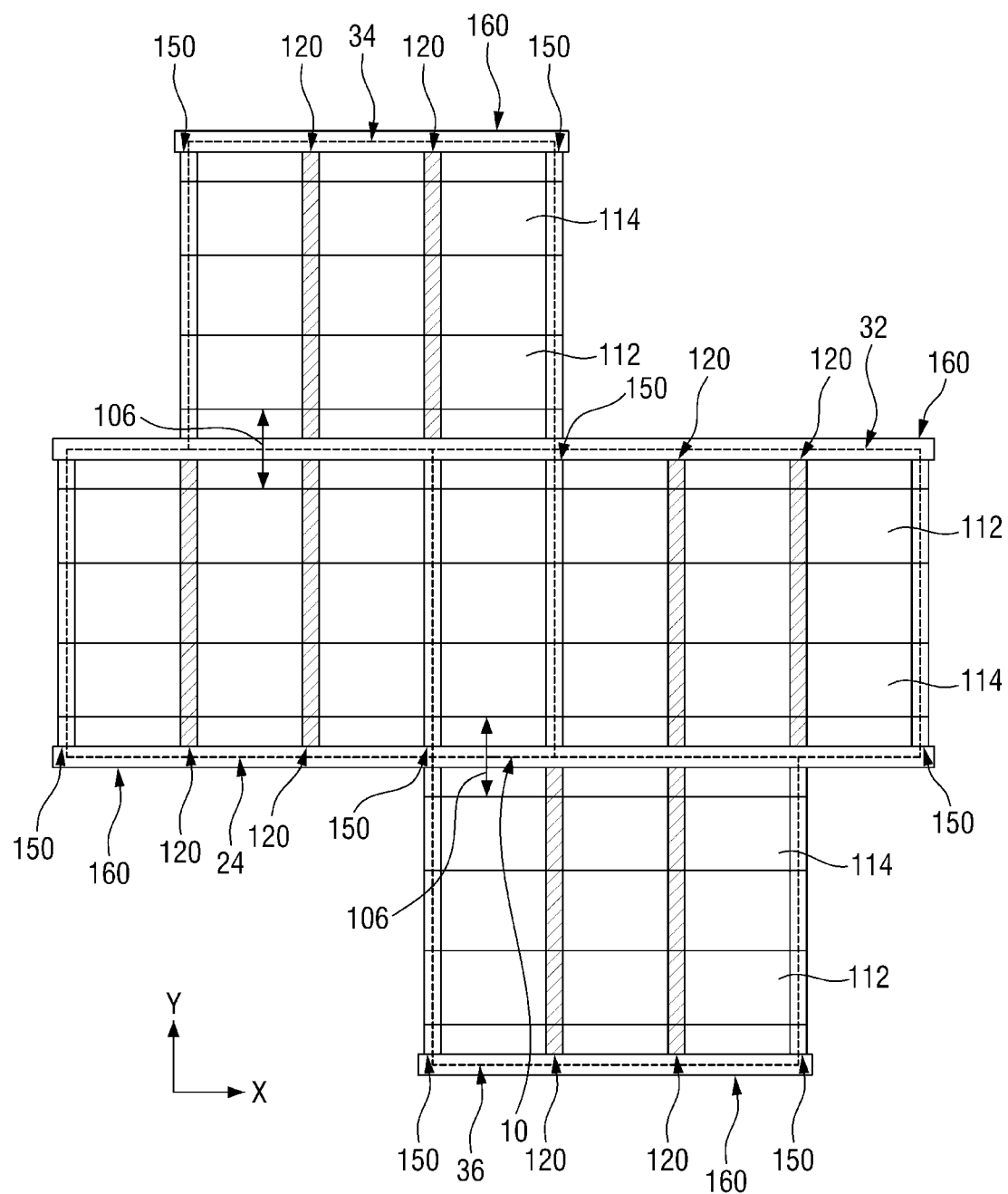
FIG. 14 is a top view for explaining the integrated circuit according to some embodiments.

FIG. 12 is a top view for explaining the integrated circuit according to some embodiments. FIG. 13 is a top view for explaining the integrated circuit according to some embodiments. FIG. 14 is a top view for explaining the integrated circuit according to some embodiments. In the following description and drawings, it will be described by only the gate stack 120, the insulating gate 150, the first active region 112, the second active region 114, and the cell gate cutting pattern 160. In addition, repeated contents of parts explained using FIGS. 1 to 11 will be simplified or omitted.

Referring to FIGS. 12 to 14, the integrated circuit according to some embodiments may include a first insulating filler cell 10, a third standard cell 24, a seventh standard cell 32, an eighth standard cell 34, and a ninth standard cell 36.

The third standard cell 24, the seventh standard cell 32, the eighth standard cell 34, and the ninth standard cell 36 may have a width of 3 CPP in the first direction X. Each of the third standard cell 24, the seventh standard cell 32, the eighth standard cell 34, and the ninth standard cell 36 may have an insulating gate 150 located at the boundary. Further, each of the third standard cell 24, the seventh standard cell 32, the eighth standard cell 34, and the ninth standard cell 36 may include two gate stacks 120.

The first insulating filler cell 10 may form a boundary with the third standard cell 24 and the seventh standard cell 32 adjacent to each other in the first direction X. Each of the third standard cell 24 and the seventh standard cell 32 may form a boundary with the first insulating filler cell 10 in the insulating gate 150 included in the first insulating filler cell 10.

The eighth standard cell 34 may be disposed to be adjacent to the first insulating filler cell 10 in the second direction Y. The ninth standard cell 36 may be disposed to be adjacent to the first insulating filler cell 10 in the second direction Y. The first insulating filler cell 10 may be disposed between the eighth standard cell 34 and the ninth standard cell 36.

In FIG. 12, the insulating gates 150 of the first insulating filler cell 10 may be aligned, in the second direction Y, with the gate stacks 120 included in the eighth standard cell 34, respectively. The insulating gates 150 of the first insulating filler cell 10 may be aligned, in the second direction Y, with the gate stacks 120 included in the ninth standard cell 36, respectively.

In FIG. 13, one of the two insulating gates 150 of the first insulating filler cell 10 located on the boundary with the third standard cell 24 may be aligned, in the second direction Y, with the gate stack 120 of the eighth standard cell 34. The other of the two insulating gates 150 of the first insulating filler cell 10 located on the boundary with the seventh standard cell 32 may be aligned, in the second direction Y, with the insulating gate 150 located on the boundary of the eighth standard cell 34. However, the other of the two insulating gates 150 of the first insulating filler cell 10 may be aligned, in the second direction Y, with the gate stacks 120 included in the ninth standard cell 36.

In FIG. 14, one of the two insulating gates 150 of the first insulating filler cell 10 located on the boundary with the third standard cell 24 may be aligned, in the second direction Y, with the gate stack 120 of the eighth standard cell 34. The other of the two insulating gates 150 of the first insulating filler cell 10 located on the boundary with the seventh standard cell 32 may be aligned, in the second direction Y, with the insulating gate 150 located on the boundary of the eighth standard cell 34. The one of the two insulating gates 150 of the first insulating filler cell 10 located on the boundary with the third standard cell 24 may be aligned, in the second direction Y, with the insulating gate 150 located on the boundary of the ninth standard cell 36. The other of the two insulating gates 150 of the first insulating filler cell 10 located on the boundary with the seventh standard cell 32 may be aligned, in the second direction Y, with the gate stack 120 of the ninth standard cell 36.

Each of the third standard cell 24, the seventh standard cell 32, the eighth standard cell 34, and the ninth standard cell 36 may include a p-type transistor and an n-type transistor formed on the first active region 112 and the second active region 114, respectively.

The widths in the first direction X of the third standard cell 24, the seventh standard cell 32, the eighth standard cell 34, and the ninth standard cell 36 described above are exemplary, and therefore is not limited thereto.

FIGS. 15 to 19A and 19B are diagrams for explaining the integrated circuit according to some embodiments.

Figure 15:
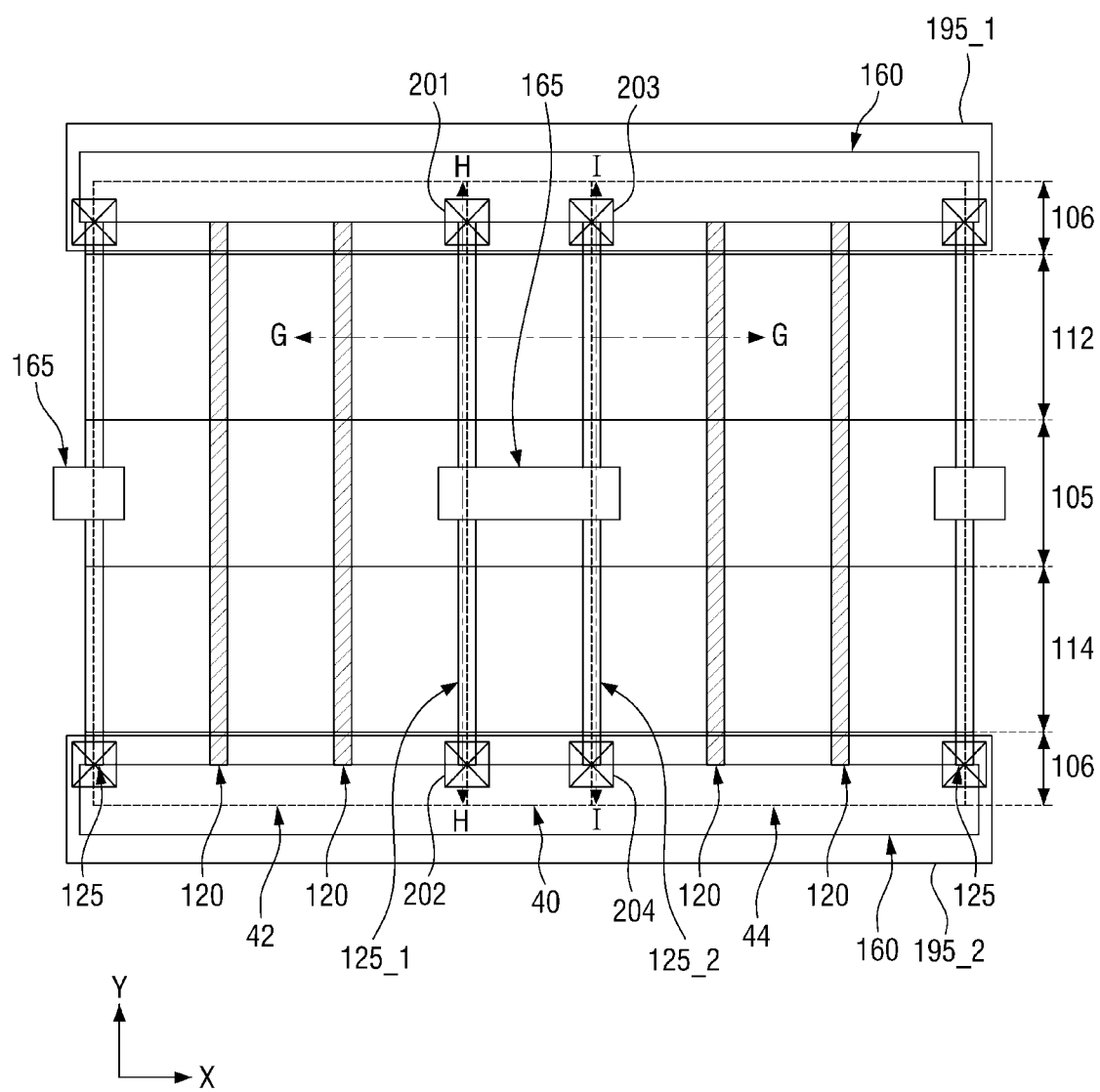
FIGS. 15 to 18, and 19A and 19B are diagrams for explaining the integrated circuit according to some embodiments.
Figure 16:
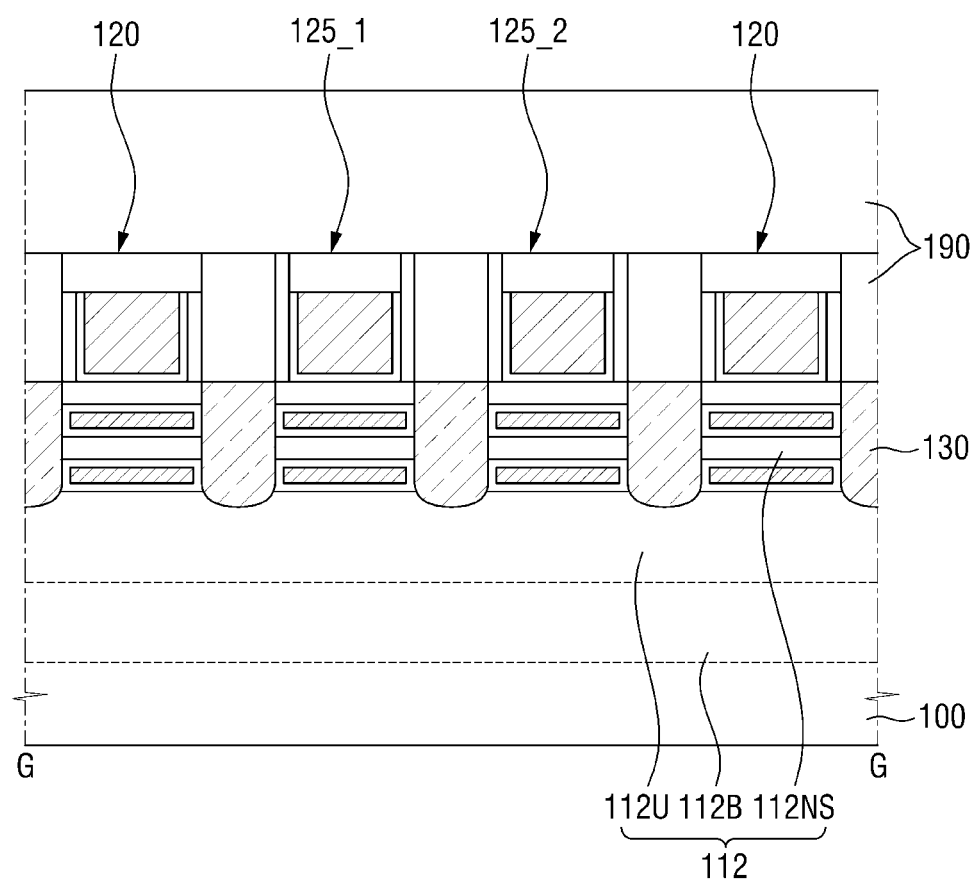
Figure 17:
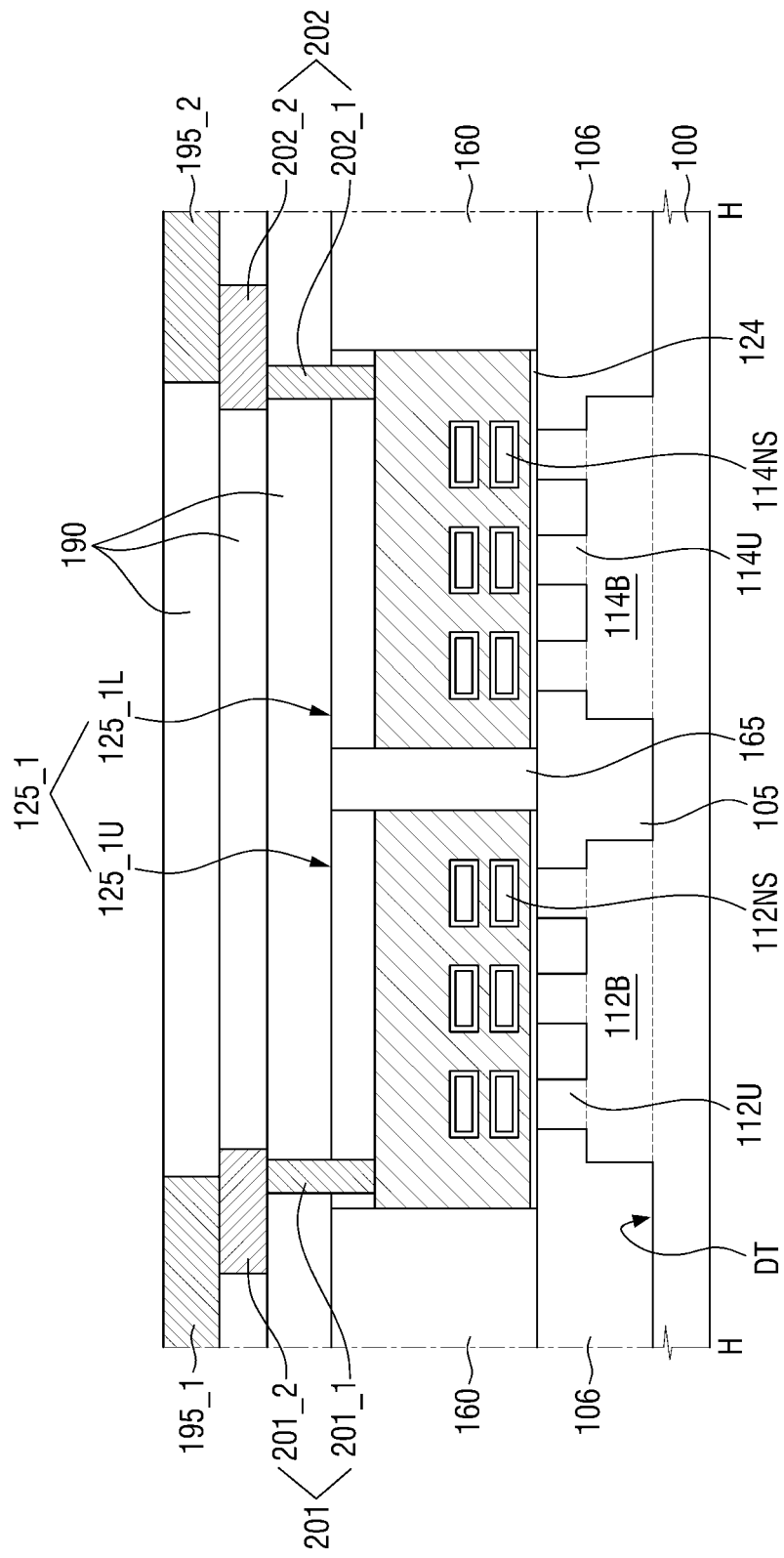
Figure 18:
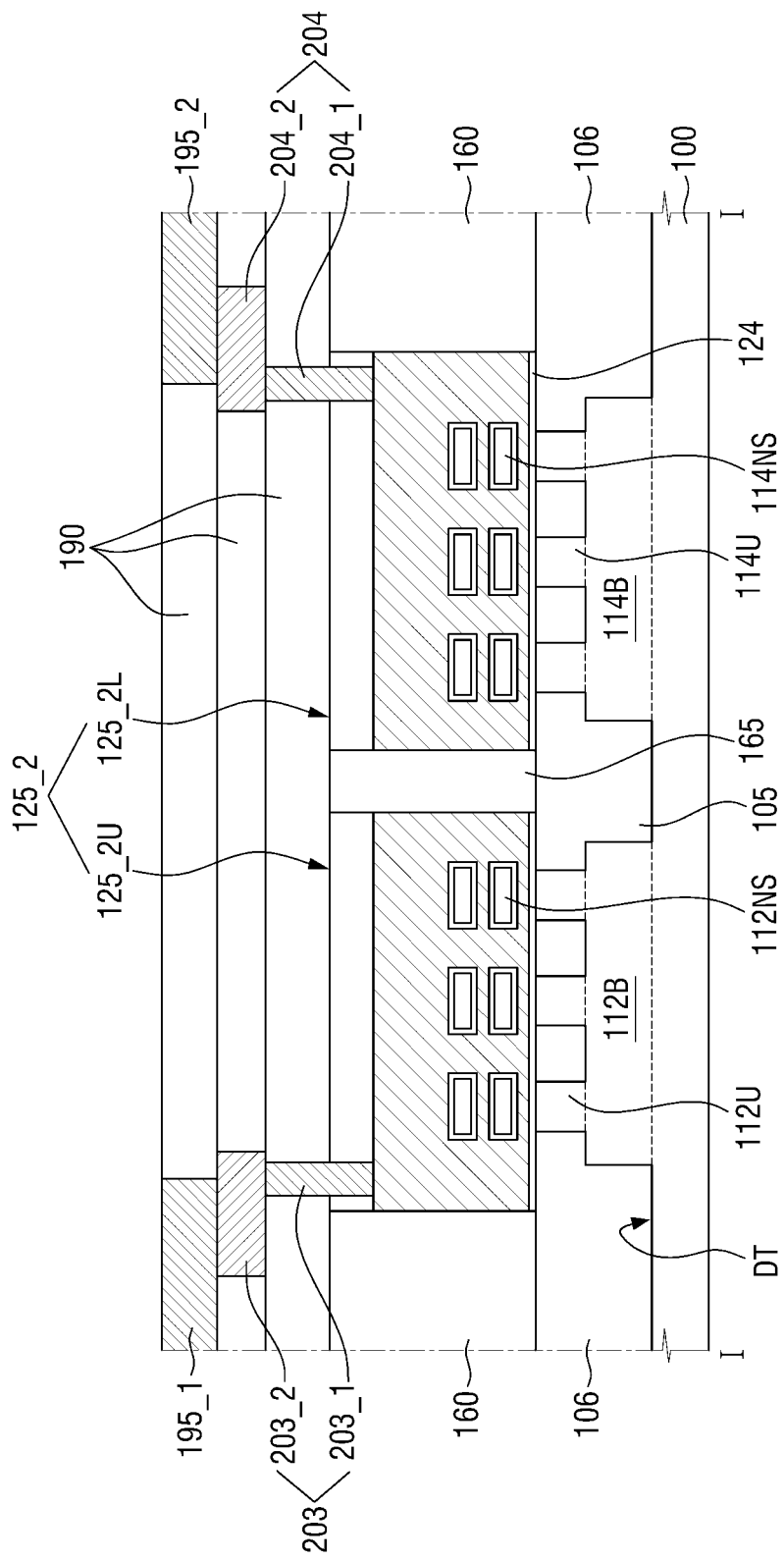
Figure 19A:
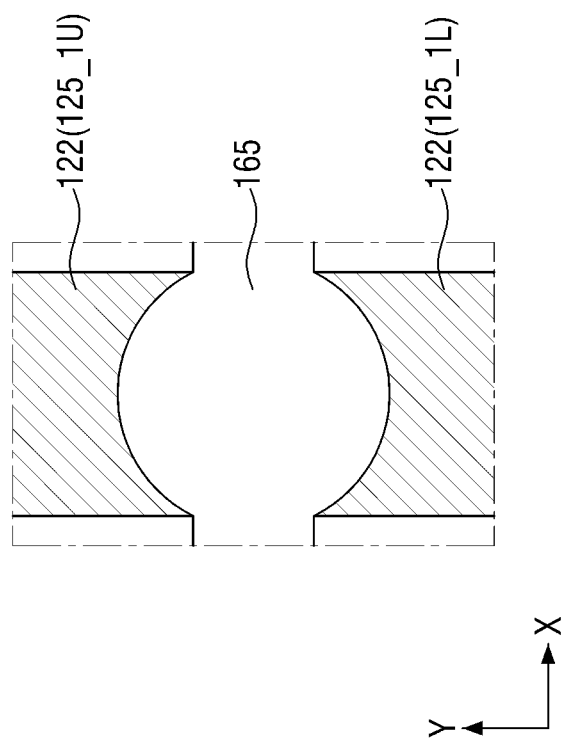
Figure 19B:
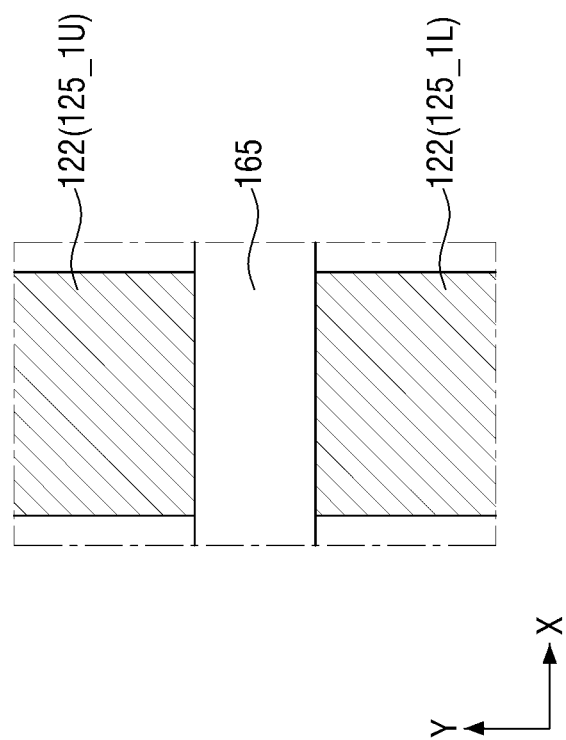

FIG. 15 is a top view of the integrated circuit for explaining the integrated circuit according to some embodiments. FIG. 16 is a cross-sectional view taken along line G-G of FIG. 15. FIG. 17 is a cross-sectional view taken along line H-H of FIG. 15. FIG. 18 is a cross-sectional view taken along line I-I of FIG. 15. FIGS. 19A and 19B are exemplary views showing a plan view of the gate electrode in a floating (or dummy) gate cutting pattern. Repeated contents of parts explained above in the following description will be simplified or omitted.

Referring to FIGS. 15 to 19A and 19B, the integrated circuit according to some embodiments may include a tenth standard cell 42, an eleventh standard cell 44, and a conductive filler cell 40.

The integrated circuit may include a plurality of gate stacks 120 and a plurality of floating gate stacks 125, 125_1 and 125_2. The gate stack 120 and the floating gate stacks 125, 125_1 and 125_2 may extend along the second direction Y. The gate stack 120 and the floating gate stacks 125, 125_1 and 125_2 may be disposed to be adjacent to each other in the first direction X. The gate stack 120 and the floating gate stacks 125, 125_1 and 125_2 may be spaced 1 CPP apart from each other in the first direction. The plurality of floating gate stacks 125, 125_1 and 125_2 may be also referred to as a plurality of dummy gate stacks. As used herein, the term "dummy" is used to refer to a component that has the same or similar structure and shape as other components but does not have a substantial function and exists only as a pattern in the device.

Each of the floating gate stacks 125, 125_1 and 125_2 may have the same stacked structure as that of the gate stack 120. Each of the floating gate stacks 125, 125_1 and 125_2 may include a gate electrode (122 of FIG. 2), a gate insulating film (124 of FIG. 2), a gate spacer (126 of FIG. 2), and a gate capping film 128.

The floating gate stacks 125, 125_1 and 125_2 may be disposed over the first active region 112 and the second active region 114. The floating gate stacks 125, 125_1 and 125_2 may extend from the first active region 112 to the second active region 114 and may cross the active region separation film 105. Some of the floating gate stacks 125, 125_1 and 125_2 may extend to the top of the cell separation film 106. In the integrated circuit according to some embodiments, at least some of the floating gate stacks 125, 125_1 and 125_2 may be disposed at a boundary of a standard cell extending in the second direction Y to electrically separate the standard cell from other standard cells adjacent thereto. The floating gate stacks 125, 125_1 and 125_2 may electrically separate the standard cells adjacent to each other rather than physically separating the standard cells. Although the floating gate stacks 125, 125_1 and 125_2 have the same structure as that of the gate stack 120, since the floating gate stacks 125, 125_1 and 125_2 are connected to the power rails 195_1 and 195_2, the floating gate stacks 125, 125_1 and 125_2 do not operate as gates of the transistor. The floating gate stacks 125, 125_1 and 125_2 may be disposed not only at the boundary of the standard cell, but also inside the standard cell. However, hereinafter, the floating gate stacks 125, 125_1 and 125_2 will be described as being disposed at the boundary of the standard cell extending in the second direction Y.

The cell gate cutting pattern 160 may be disposed on the cell separation film 106. The cell gate cutting pattern 160 may extend in first direction X along the boundary of the tenth standard cell 42, the boundary of the conductive filler cell 40 and the boundary of the eleventh standard cell 44. The gate stack 120 and the floating gate stacks 125, 125_1 and 125_2 may be disposed between the cell gate cutting patterns 160 spaced apart from each other in the second direction Y. The cell gate cutting pattern 160 may cut the gate stack 120 or the floating gate stacks 125, 125_1 and 125_2 at the boundary of the cell. The cell gate cutting pattern 160 may be in contact with the gate stack 120 and the floating gate stacks 125, 125_1 and 125_2.

A floating (or dummy) gate cutting pattern 165 may be disposed on the active region separation film 105. The floating gate cutting pattern 165 may cut the floating gate stacks 125, 125_1 and 125_2 into two parts. The two parts of the floating gate stacks 125, 125_1 and 125_2 separated by the floating gate cutting pattern 165 are electrically insulated from each other. The floating gate cutting pattern 165 is in contact with the floating gate stacks 125, 125_1 and 125_2 separated into two parts. The floating gate cutting pattern 165 may include, for example, an insulating material. At the time of the fabricating process, the floating gate cutting pattern 165 may be formed in the same fabricating process as the cell gate cutting pattern 160, but is not limited thereto.

The conductive filler cell 40 may be disposed between the tenth standard cell 42 and the eleventh standard cell 44. The tenth standard cell 42 and the eleventh standard cell 44 may be disposed to be adjacent to each other in the first direction X with the conductive filler cell 40 interposed therebetween. The boundary between the conductive filler cell 40 and the tenth standard cell 42 extends in the second direction Y, and the boundary between the conductive filler cell 40 and the eleventh standard cell 44 extends in the second direction Y.

The conductive filler cell 40 may include a first floating gate stack 125_1 and a second floating gate stack 125_2 which cross the first active region 112 and the second active region 114 and are adjacent to each other in the first direction X. The first floating gate stack 125_1 and the second floating gate stack 125_2 may be located at opposite boundaries extending in the second direction Y of the conductive filler cell 40, respectively. The conductive filler cell 40 may have a one-pitch dimension in the first direction X.

The conductive filler cell 40 may further include a floating gate cutting pattern 165 disposed on the active region separation film 105. The first floating gate stack 125_1 includes a first upper floating gate stack 125_1U and a first lower floating gate stack 125_1L separated by a floating gate cutting pattern 165. The second floating gate stack 125_2 includes a second upper floating gate stack 125_2U and a second lower floating gate stack 125_2L separated by the floating gate cutting pattern 165.

The conductive filler cell 40 may further include first floating (or filler) contacts 201 and 202 and second floating (or filler) contacts 203 and 204. The first filler contacts 201 and 202 connect the first floating gate stack 125_1 to the power rails 195_1 and 195_2. The second filler contacts 203 and 204 connect the second floating gate stack 125_2 to the power rails 195_1 and 195_2. The first filler contacts 201 and 202 include a first upper filler contact 201, and a first lower filler contact 202. The second filler contacts 203 and 204 include a second upper filler contact 203, and a second lower filler contact 204. The first upper filler contact 201 connects the first upper floating gate stack 125_1U to the upper power rail 195_1. The first lower filler contact 202 connects the first lower floating gate stack 125_1L to the lower power rail 195_2. The second upper filler contact 203 connects the second upper floating gate stack 125_2U to the upper power rail 195_1. The second lower filler contact 204 connects the second lower floating gate stack 125_2L to the lower power rail 195_2.

In the integrated circuit according to some embodiments, the gate insulating film 124 included in each of the first floating gate stack 125_1 and the second floating gate stack 125_2 does not extend along the sidewall of the floating gate cutting pattern 165.

The first filler contacts 201 and 202 and the second filler contacts 203 and 204 may be disposed at a position where the first floating gate stack 125_1 and the second floating gate stack 125_2 overlap the cell separation film 106. The first filler contacts 201 and 202 and the second filler contacts 203 and 204 are not disposed inside the cell, but may be located at the boundary of the cell. Therefore, a routing wiring for connecting the power rails 195_1 and 195_2 and the floating gate stacks 125_1 and 125_2 may be simplified. For example, in the integrated circuit according to some embodiments of the present inventive concept, the connection between the power rails 195_1 and 195_2 and the floating gate stacks 125_1 and 125_2 do not pass through the source/drain contacts (170 and 170_1 of FIG. 5).

In the integrated circuit according to some embodiments, the first filler contacts 201 and 202 and the second filler contacts 203 and 204 may include contact parts 201_1, 202_1, 203_1 and 204_1 and via parts 201_2, 202_2, 203_2 and 204_2. The contact parts 201_1, 202_1, 203_1 and 204_1 may be similar to the gate contact 175 of FIG. 5. The via parts 201_2, 202_2, 203_2 and 204_2 may be similar to the gate via 185 of FIG. 8.

The tenth standard cell 42 may form a boundary with the conductive filler cell 40. The conductive filler cell 40 may form a boundary with the tenth standard cell 42 at the first floating gate stack 125_1. The tenth standard cell 42 may include a third floating gate stack 125 located at a boundary different from the conductive filler cell 40. The floating gate stacks 125 and 125_1 may be located at the boundary of the tenth standard cell 42. The tenth standard cell 42 may include one or more (e.g., two) gate stacks 120 disposed between the floating gate stacks 125 and 125_1 located at the boundaries of the tenth standard cell 42.

The eleventh standard cell 44 may form a boundary with the conductive filler cell 40. The conductive filler cell 40 may form a boundary with the eleventh standard cell 44 at the second floating gate stack 125_2. The eleventh standard cell 44 may include a third floating gate stack 125 located at a boundary different from the conductive filler cell 40. The floating gate stacks 125 and 125_2 may be located at the boundaries of the eleventh standard cell 44. The eleventh standard cell 44 may include one or more (e.g., two) gate stacks 120 disposed between the floating gate stacks 125 and 125_2 located at the boundaries of the eleventh standard cell 44.

The third floating gate stack 125 located at the boundary between the tenth standard cell 42 and the eleventh standard cell 44 may be separated into two parts by the floating gate cutting pattern 165. The third floating gate stack 125 may also be connected to the power rails 195_1 and 195_2 through the filler contacts 201 and 203, and 202 and 204.

The tenth standard cell 42 and the eleventh standard cell 44 may further include a first active region 112 and a second active region 114. The tenth standard cell 42 and the eleventh standard cell 44 may include a p-type transistor and an n-type transistor formed on the first active region 112 and the second active region 114, respectively.

The tenth standard cell 42, the eleventh standard cell 44, and the conductive filler cell 40 may further include a cell gate cutting pattern 160. The cell gate cutting pattern 160 may extend along the boundary of the tenth standard cell 42, the boundary of the conductive filler cell 40 and the boundary of the eleventh standard cell 44 extending in the first direction X. The cell gate cutting pattern 160 may be in contact with the gate stack 120 included in the tenth standard cell 42, the gate stack 120 included in the eleventh standard cell 44, and the first and second floating gate stacks 125_1 and 125_2.

In the integrated circuit according to some embodiments, the cell gate cutting pattern 160 may have an "I"-shaped linear shape.

In the plan view of FIG. 19A, the gate electrode 122 of the first upper floating gate stack 125_1U may be spaced apart from the gate electrode 122 of the first lower floating gate stack 125_1L with the floating gate cutting pattern 165 therebetween. A boundary between the gate electrode 122 of the first upper floating gate stack 125_1U and the floating gate cutting pattern 165 may have a concave shape. A boundary between the gate electrode 122 of the first lower floating gate stack 125_1L and the floating gate cutting pattern 165 may have a concave shape. The same configuration may also be applied to the gate electrode 122 of the second upper floating gate stack 125_2U and the gate electrode 122 of the second lower floating gate stack 125_2L.

In the plan view of FIG. 19B, the gate electrode 122 of the first upper floating gate stack 125_1U may be spaced apart from the gate electrode 122 of the first lower floating gate stack 125_1L with the floating gate cutting pattern 165 therebetween. A boundary between the gate electrode 122 of the first upper floating gate stack 125_1U and the floating gate cutting pattern 165 may have a flat shape. A boundary between the gate electrode 122 of the first lower floating gate stack 125_1L and the floating gate cutting pattern 165 may have a flat shape. The same configuration may also be applied to the gate electrode 122 of the second upper floating gate stack 125_2U and the gate electrode 122 of the second lower floating gate stack 125_2L.

Figure 20:
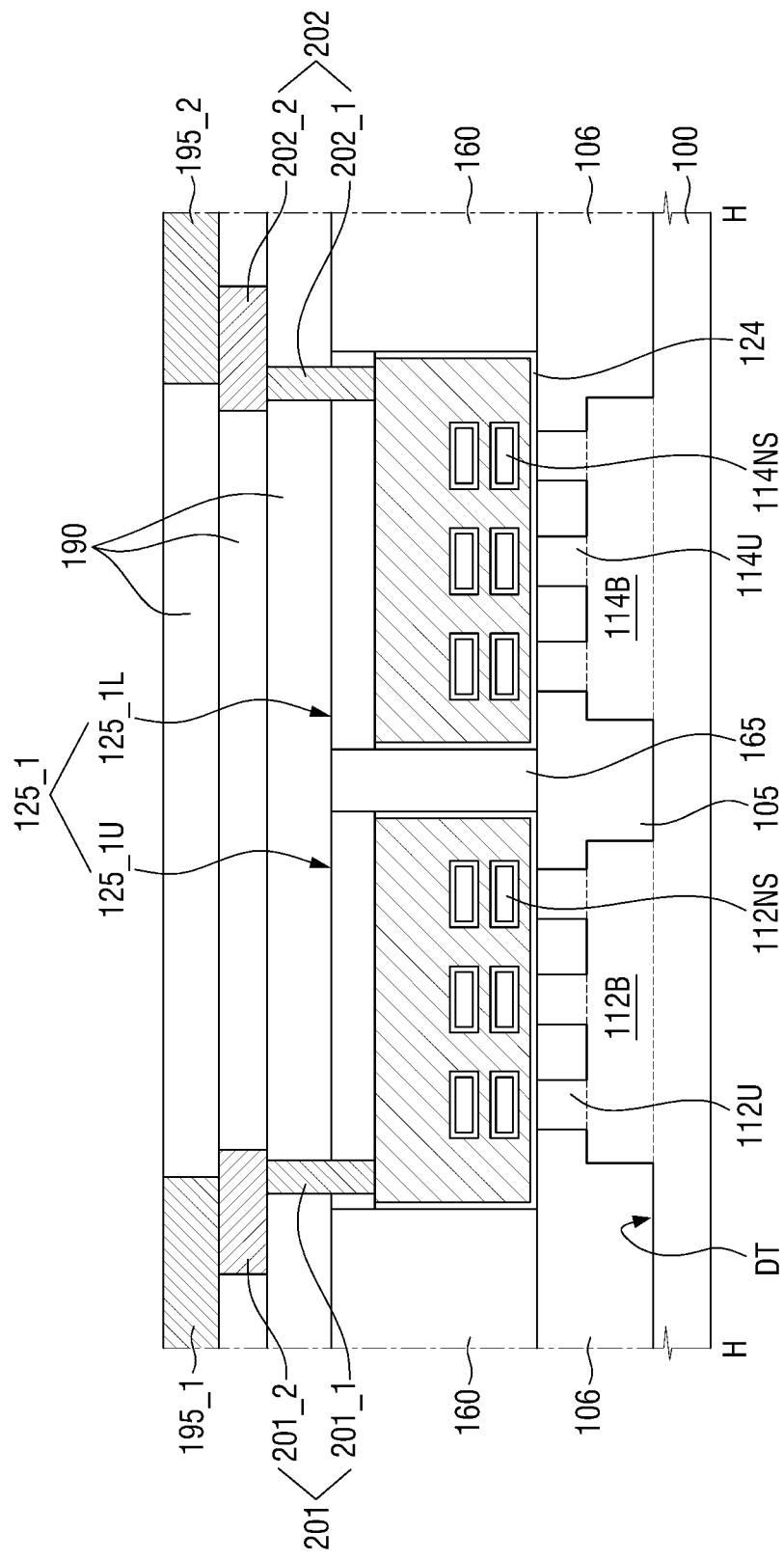
FIGS. 20 to 24 are diagrams for explaining the integrated circuit according to some embodiments, respectively.
Figure 21:
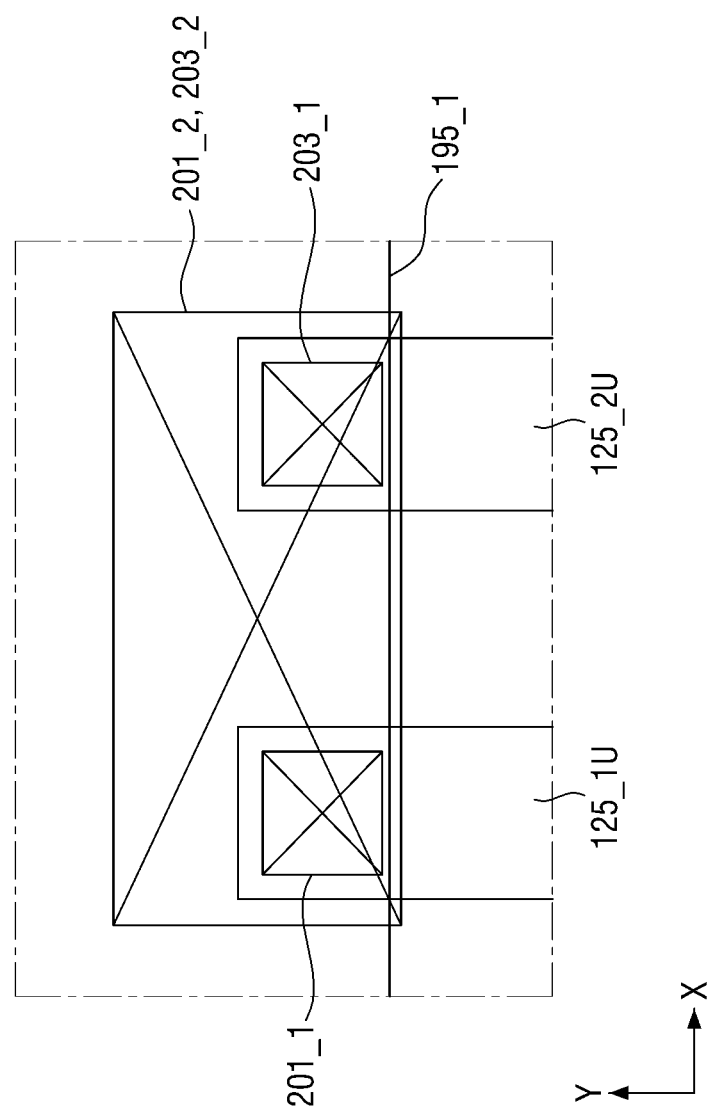
Figure 22:
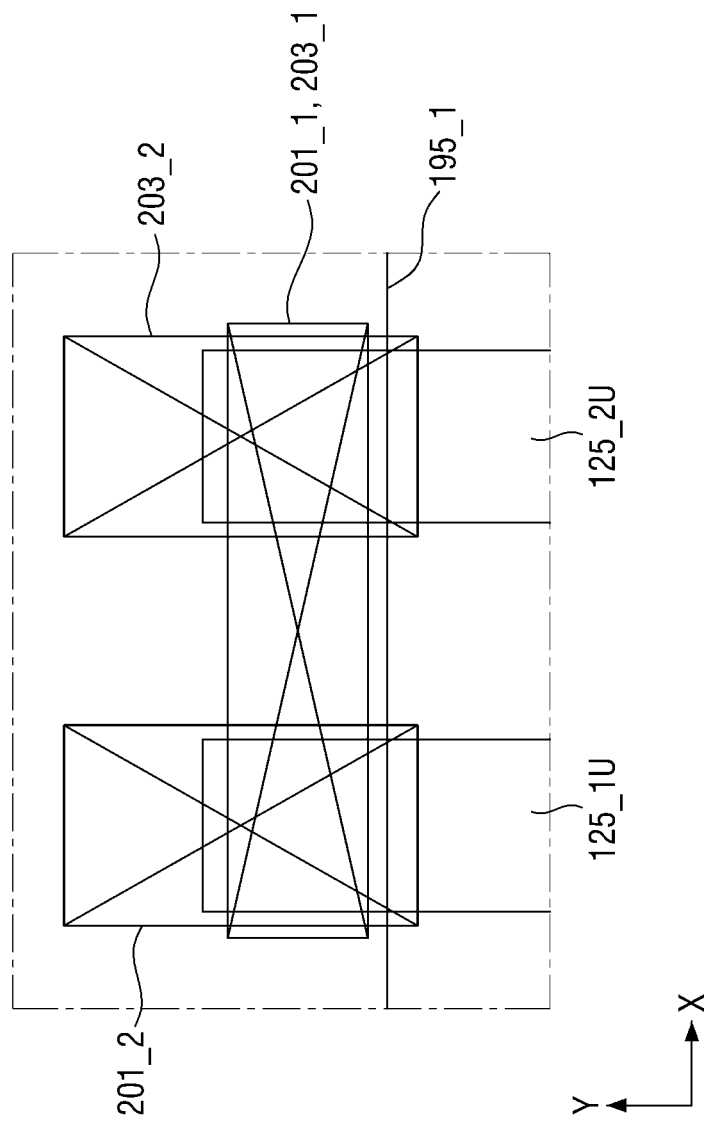
Figure 23:
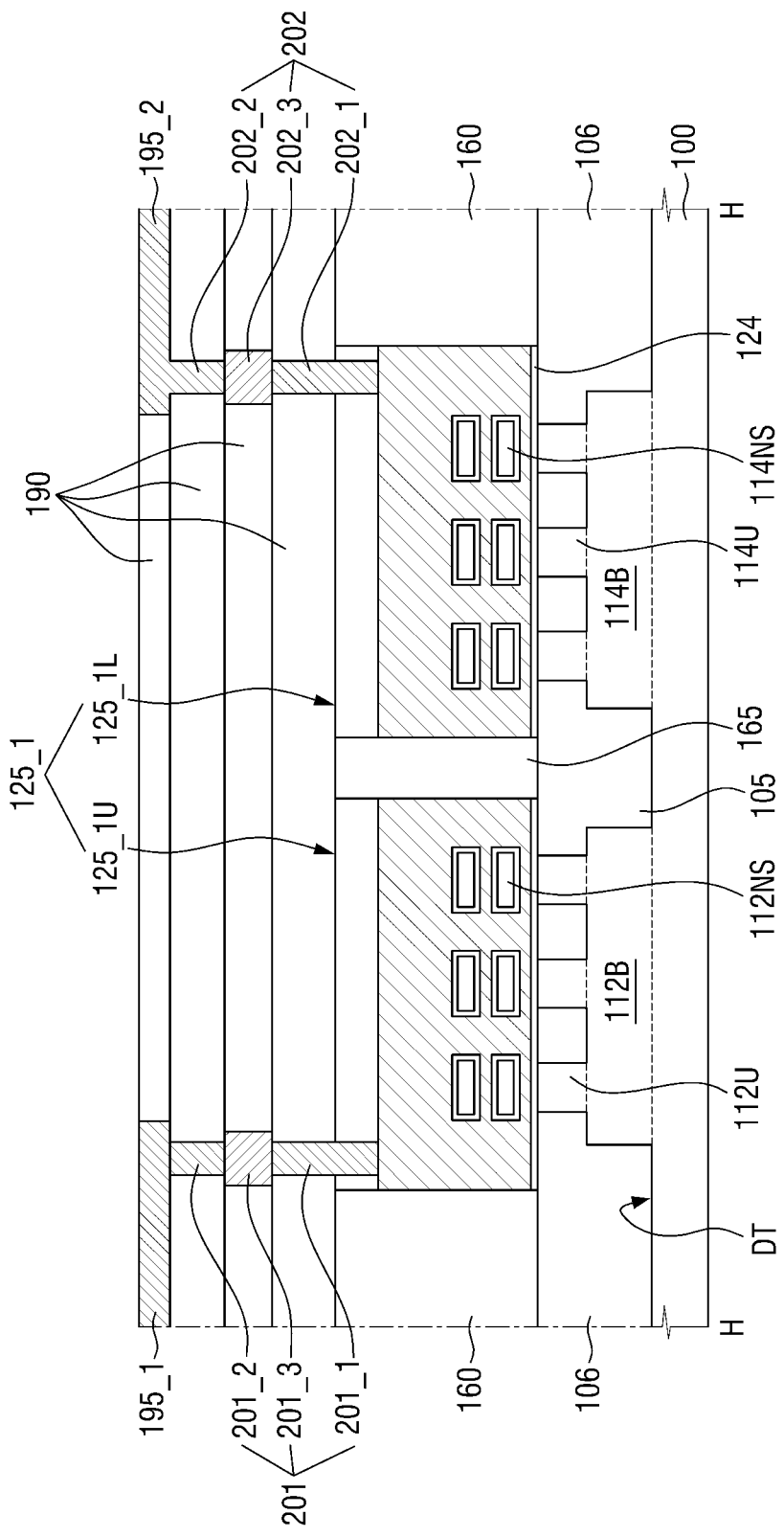
Figure 24:
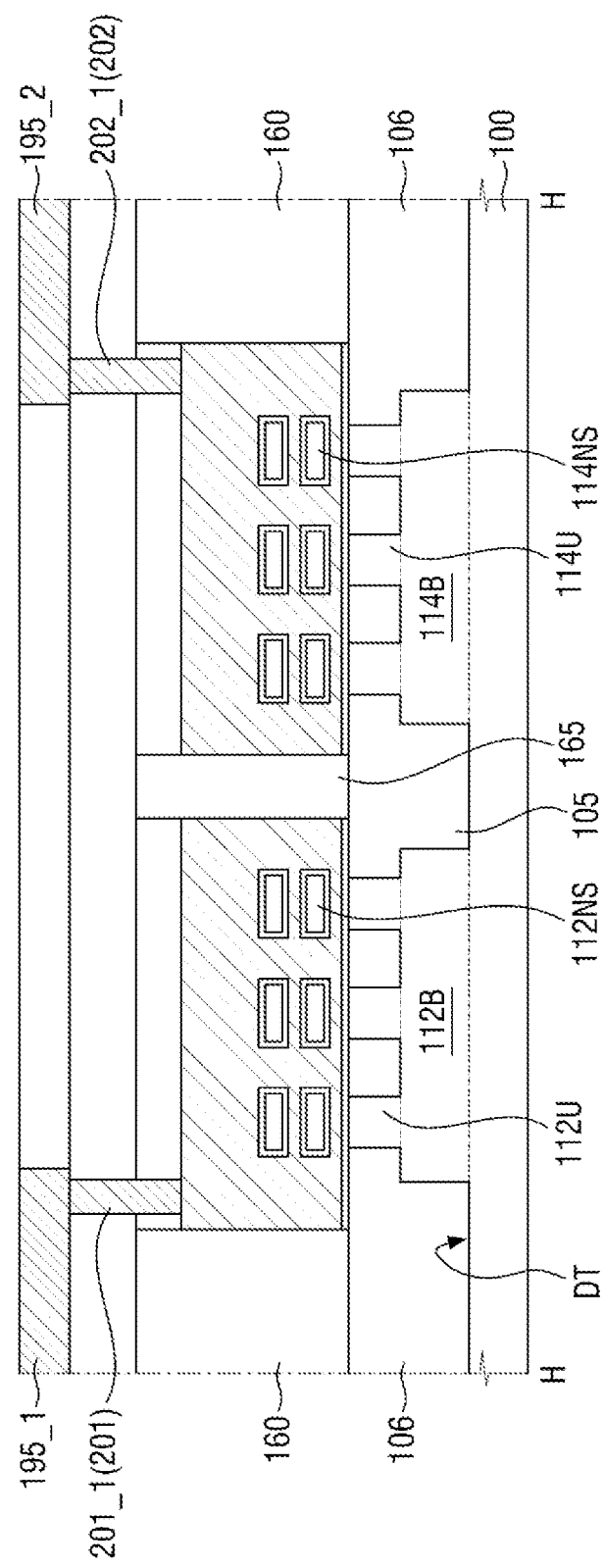

FIGS. 20 to 24 are diagrams for explaining the integrated circuit according to some embodiments, respectively. For the convenience of explanation, differences from the contents explained using FIGS. 15 to 19A and 19B will be explained. For reference, FIG. 20 is a cross-sectional view taken along line H-H of FIG. 15. FIGS. 21 and 22 are diagrams for explaining a relationship between a first upper filler contact 201 and a second upper filler contact 203. FIGS. 23 and 24 are diagrams illustrating another structure of the first filler contacts 201 and 202.

Referring to FIG. 20, in the integrated circuit according to some embodiments, the gate insulating film 124 included in the first floating gate stack 125_1 may extend along the sidewall of the floating gate cutting pattern 165.

The gate insulating film 124 included in the second floating gate stack 125_2 may extend along the sidewall of the floating gate cutting pattern as shown in FIG. 20.

Referring to FIG. 21, in the integrated circuit according to some embodiments, a via part 201_2 of the first upper filler contact 201 and a via part 203_2 of the second upper filler contact 203 may be a single conductive pattern being in contact with each other.

Similarly, a via part 202_2 of the first lower filler contact 202 and a via part 204_2 of the second lower filler contact 204 may also be a single conductive pattern connected to each other.

Referring to FIG. 22, in the integrated circuit according to some embodiments, the contact part 201_1 of the first upper filler contact and the contact part 203_1 of the second upper filler contact may be a single conductive pattern being in contact with each other.

Similarly, the contact part 202_1 of the first lower filler contact and the contact part 204_1 of the second lower filler contact may also be a single conductive pattern connected to each other.

Referring to FIG. 23, in the integrated circuit according to some embodiments, the first upper filler contact 201 and the first lower filler contact 202 may further include connecting contact parts 201_3 and 202_3, respectively.

The connecting contact parts 201_3 and 202_3 may be similar to the middle contact 176 of FIG. 10A. The second upper filler contact 203 and the second lower filler contact 204 may also further include a connecting contact part.

Referring to FIG. 24, in the integrated circuit according to some embodiments, the power rails 195_1 and 195_2 may be connected to the contact parts 201_1, 202_1, 203_1 and 204_1 without the via parts 201_2, 202_2, 203_2 and 204_2 as described with reference to FIG. 23.

Figure 25:
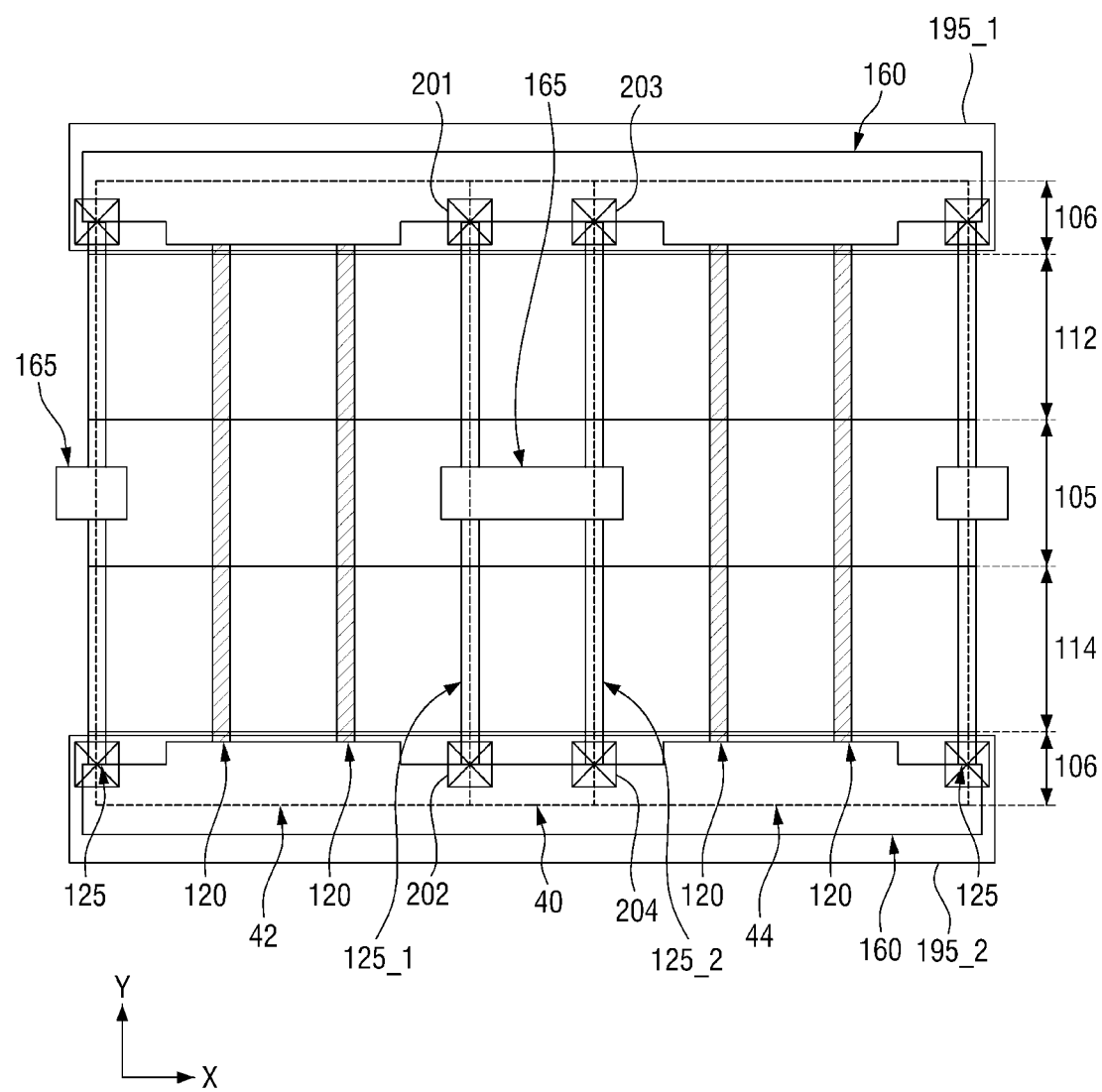
FIGS. 25 and 26 are top views for explaining the integrated circuit according to some embodiments, respectively.
Figure 26:
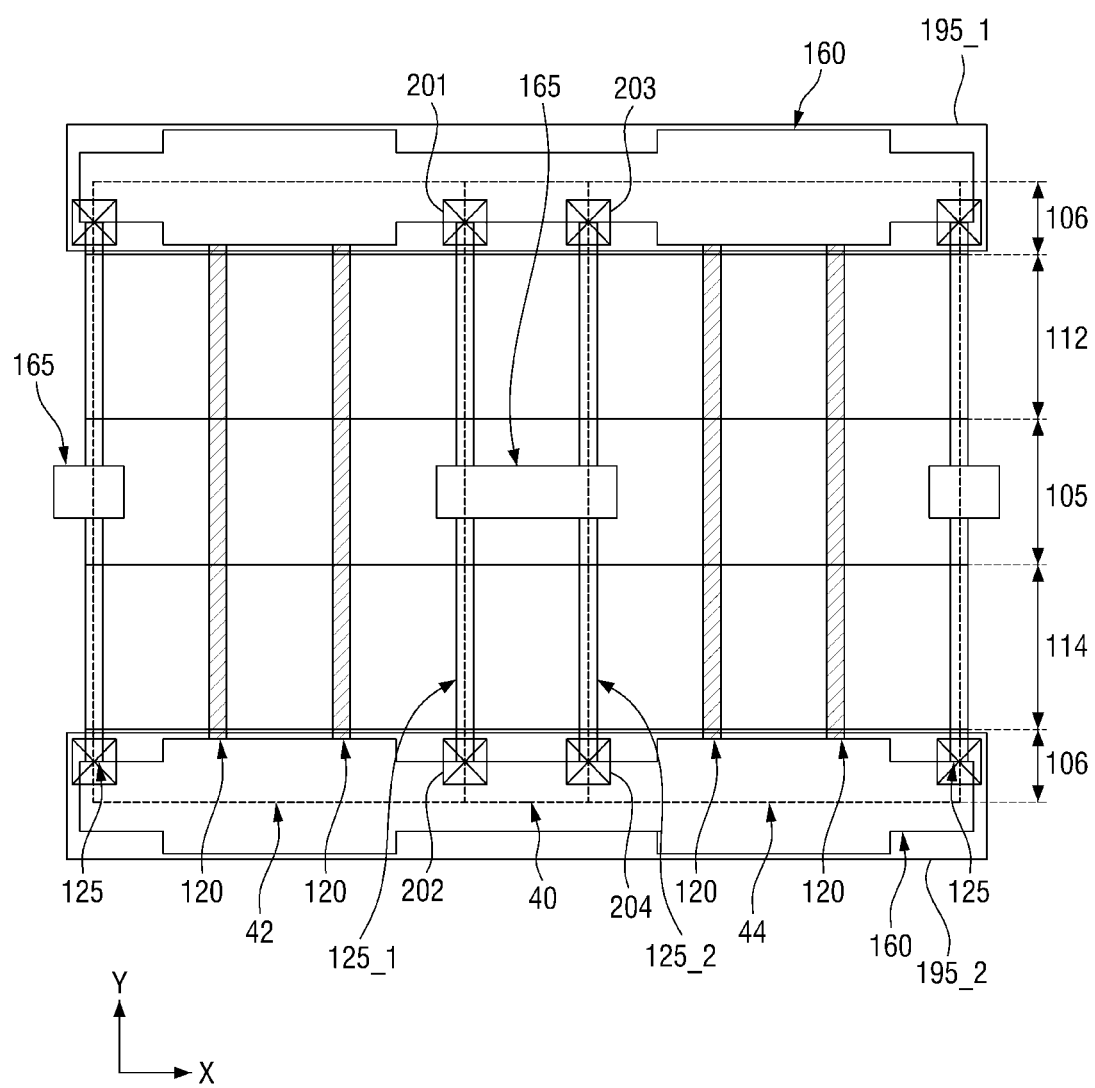

FIGS. 25 and 26 are top views for explaining the integrated circuit according to some embodiments, respectively. For the convenience of explanation, differences from the contents explained using FIGS. 15 to 19B will be explained.

Referring to FIGS. 25 and 26, in the integrated circuit according to some embodiments, the floating gate stacks 125, 125_1 and 125_2 may extend further beyond one end of the gate stack 120 in the second direction Y.

The floating gate stacks 125, 125_1 and 125_2 have lengths in the second direction Y greater than that of the gate stack 120.

In FIG. 25, the cell gate cutting pattern 160 may include a portion protruding toward the gate stack 120. A first sidewall of the cell gate cutting pattern 160 extending along the first direction X may have irregularities.

However, a second sidewall facing the first sidewall of the cell gate cutting pattern 160 may be flat without irregularities.

In FIG. 26, the cell gate cutting pattern 160 may have a shape in which a form of a dumbbell form is repeated.

Figure 27:
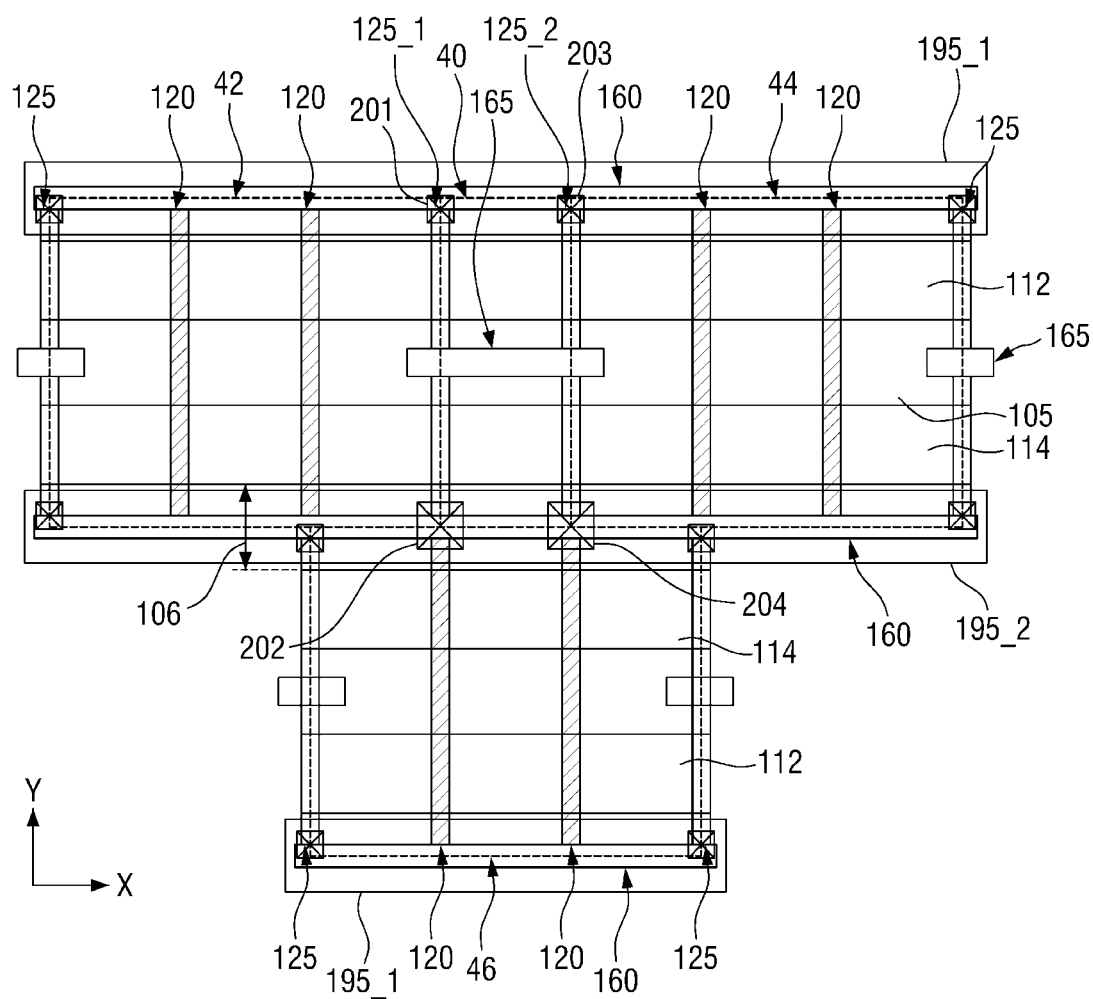
FIGS. 27 and 28 are top views for explaining the integrated circuit according to some embodiments, respectively.
Figure 28:
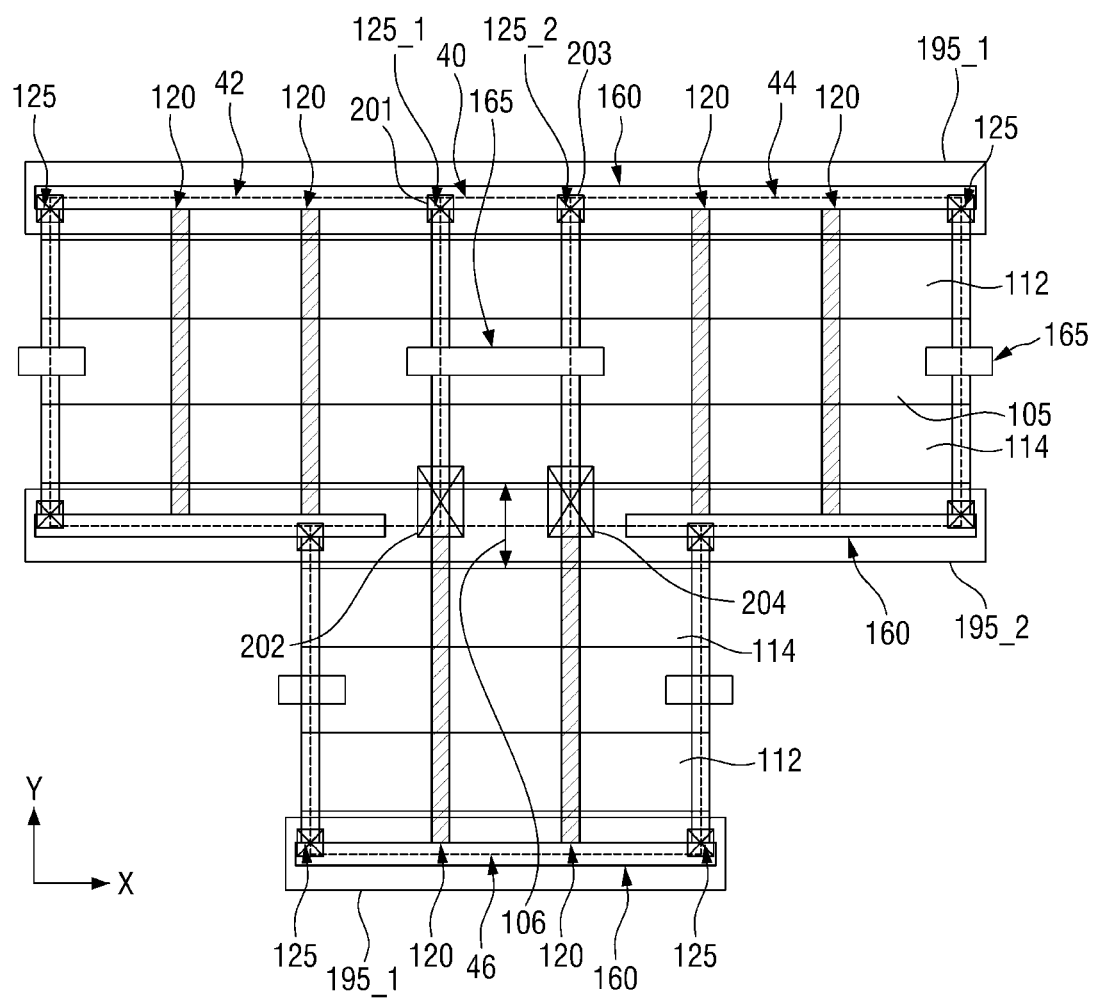

FIGS. 27 and 28 are top views for explaining the integrated circuit according to some embodiments, respectively. For the convenience of explanation, differences from the contents explained using FIGS. 15 to 19B will be explained.

Referring to FIGS. 27 and 28, the integrated circuit according to some embodiments may further include a twelfth standard cell 46.

The twelfth standard cell 46 may be adjacent to the conductive filler cell 40 in the second direction Y. The twelfth standard cell 46 may include a third floating gate stack 125 and a gate stack 120.

The first lower filler contact 202 may be connected to the gate stack 120 included in the twelfth standard cell 46. The second lower filler contact 204 may be connected to the gate stack 120 included in the twelfth standard cell 46.

In FIG. 27, the gate stack 120 included in the twelfth standard cell 46 may be in contact with the cell gate cutting pattern 160.

In FIG. 28, the gate stack 120 included in the twelfth standard cell 46 is not in contact with the cell gate cutting pattern 160. The gate stack 120 included in the twelfth standard cell 46 may be in contact with the first and second floating gate stacks 125_1 and 125_2.

Figure 29:
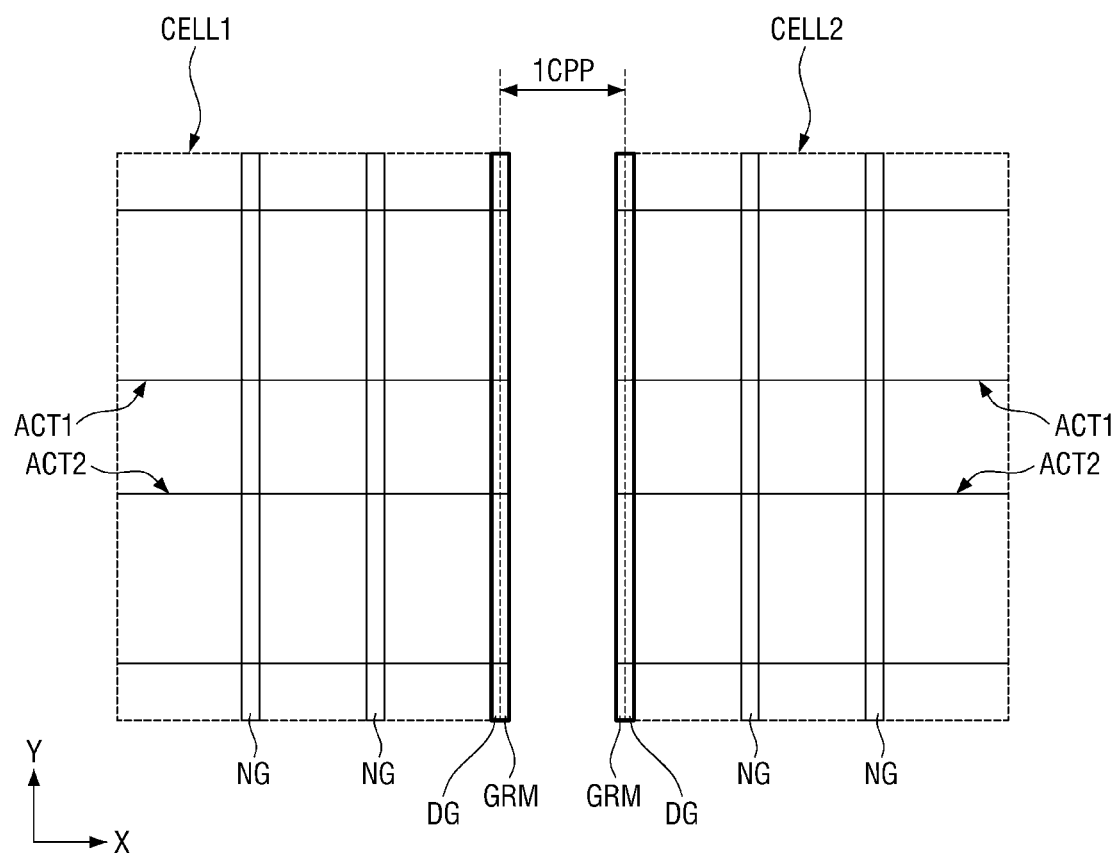
FIGS. 29 and 30 are diagrams relating to a method for designing a layout of the integrated circuit according to some embodiments.
Figure 30:
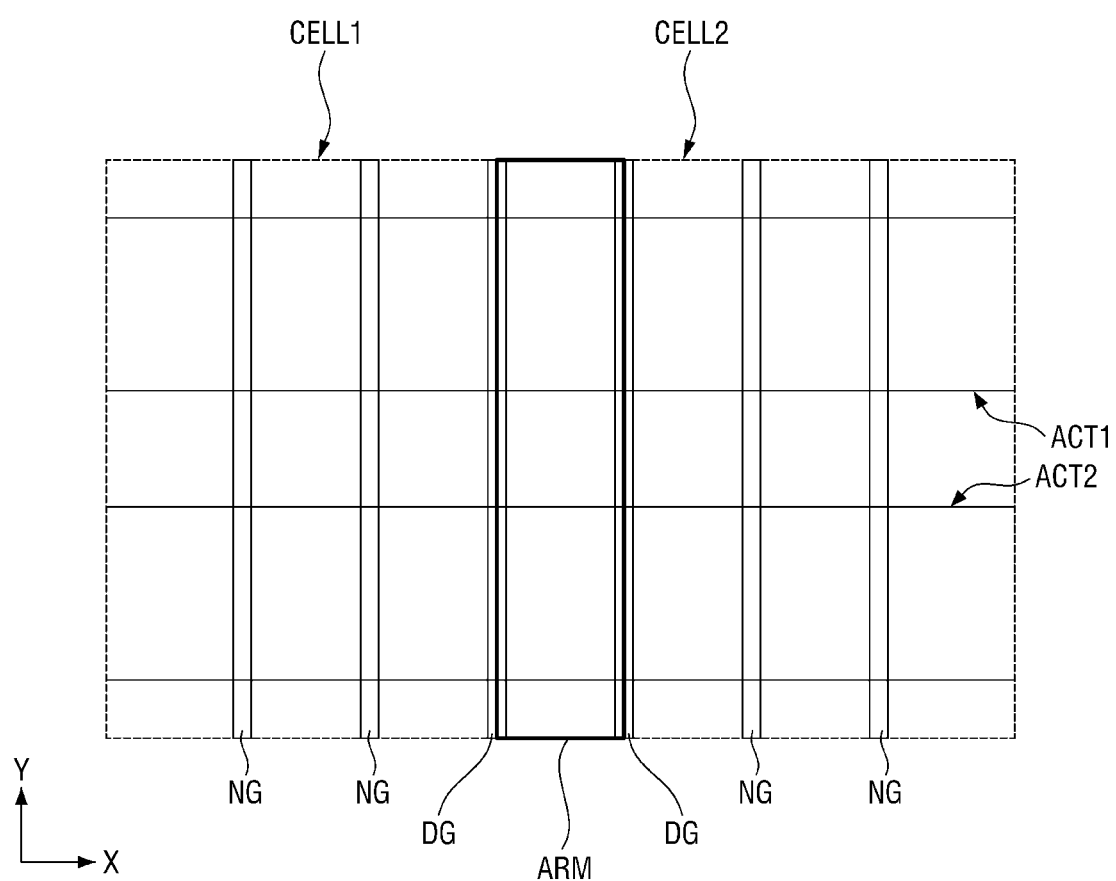

FIGS. 29 and 30 are diagrams relating to a method for designing an integrated circuit layout according to some embodiments.

Referring to FIG. 29, a first cell CELL1 and a second cell CELL2 spaced apart from each other by 1 CPP in the first direction X are disposed.

Each of the first cell CELL1 and the second cell CELL2 includes a normal gate NG and a dummy gate DG spaced apart from each other in the first direction X. Each of the first cell CELL1 and the second cell CELL2 may include a first free active region ACT1 and a second free active region ACT2 spaced apart from each other in the second direction Y.

Each of the first cell CELL1 and the second cell CELL2 may include a gate removal mask GRM for removing the dummy gate DG. The gate removal mask GRM included in the first cell CELL1 is spaced apart by 1 CPP from the gate removal mask GRM included in the second cell CELL2.

The first free active region ACT1 and the second free active region ACT2 included in each of the first cell CELL1 and the second cell CELL2 are not connected to each other.

Referring to FIG. 30, the first free active region ACT1 and the second free active region ACT2 of the first cell CELL1 and the second cell CELL2 may be connected to each other according to design.

Also, the gate removal mask GRM may be replaced with the active region removal mask ARM. Therefore, SDB (single diffusion break) masks separated from each other may be changed to one DDB (double diffusion mask).

In concluding the detailed description, those skilled in the art will appreciate that many variations and modifications may be made to the preferred embodiments without substantially departing from the principles of the present inventive concept. Therefore, the disclosed preferred embodiments of the invention are used in a generic and descriptive sense only and not for purposes of limitation.

What is claimed is:

1. An integrated circuit comprising:
   a first standard cell including a first p-type transistor and a first n-type transistor;
   a second standard cell which includes a second p-type transistor and a second n-type transistor and is spaced apart from the first standard cell in a first direction;
   a filler cell which includes a first dummy gate stack and a second dummy gate stack, the filler cell disposed between the first standard cell and the second standard cell, wherein each of the first dummy gate stack and the second dummy gate stack extends in a second direction different from the first direction;
   a power rail extending in the first direction and connected to the first dummy gate stack and the second dummy gate stack; and
   a cell separation film extending in the first direction along a boundary of the first standard cell, a boundary of the filler cell, and a boundary of the second standard cell, and overlapping the power rail,
   wherein:
   the filler cell has a one-pitch dimension,
   the first dummy gate stack and the second dummy gate stack are spaced the one-pitch dimension apart from each other in the first direction,
   the first dummy gate stack of the filler cell is disposed at a boundary between the first standard cell and the filler cell,
   the second dummy gate stack of the filler cell is disposed at a boundary between the second standard cell and the filler cell,
   the filler cell includes a first filler contact connected to the first dummy gate stack, and a second filler contact connected to the second dummy gate stack, and
   the first filler contact and the second filler contact overlap the cell separation film.

2. The integrated circuit of claim 1, wherein the first dummy gate stack and the second dummy gate stack overlap the cell separation film.

3. The integrated circuit of claim 1,
   wherein the first p-type transistor and the second p-type transistor are formed on a first active region extending in the first direction, wherein the first n-type transistor and the second n-type transistor are formed on a second active region extending in the first direction, and wherein the first active region and the second active region are spaced apart from each other in the second direction.

4. The integrated circuit of claim 3, further comprising:
an active region separation film extending in the first direction and interposed between the first active region and the second active region,
wherein:
the filler cell further includes a dummy gate cutting pattern on the active region separation film,
the first dummy gate stack includes a first portion and a second portion separated by the dummy gate cutting pattern,
the second dummy gate stack includes a first portion and a second portion separated by the dummy gate cutting pattern,
the power rail includes an upper power rail and a lower power rail spaced apart from each other in the second direction,
the upper power rail is connected to the first portion of the first dummy gate stack and the first portion of the second dummy gate stack, and
the lower power rail is connected to the second portion of the first dummy gate stack and the second portion of the second dummy gate stack.

5. The integrated circuit of claim 4,
wherein a boundary between the first portion of the first dummy gate stack and the dummy gate cutting pattern, a boundary between the second portion of the first dummy gate stack and the dummy gate cutting pattern, a boundary between the first portion of the second dummy gate stack and the dummy gate cutting pattern, and a boundary between the second portion of the second dummy gate stack and the dummy gate cutting pattern have a concave shape in a plan view.

6. The integrated circuit of claim 4,
wherein a boundary between the first portion of the first dummy gate stack and the dummy gate cutting pattern, a boundary between the second portion of the first dummy gate stack and the dummy gate cutting pattern, a boundary between the first portion of the second dummy gate stack and the dummy gate cutting pattern, and a boundary between the second portion of the second dummy gate stack and the dummy gate cutting pattern have a flat shape in a plan view.

7. The integrated circuit of claim 4,
wherein the first portion of the first dummy gate stack, the second portion of the first dummy gate stack, the first portion of the second dummy gate stack, and the second portion of the second dummy gate stack are in contact with a sidewall of the dummy gate cutting pattern.

8. The integrated circuit of claim 1, further comprising:
a cell gate cutting pattern extending in the first direction on the cell separation film,
wherein the first standard cell includes a first gate stack extending in the second direction,
wherein the second standard cell includes a second gate stack extending in the second direction, and
wherein the first gate stack, the second gate stack, the first dummy gate stack, and the second dummy gate stack are in contact with the cell gate cutting pattern.

9. The integrated circuit of claim 8,
wherein the cell gate cutting pattern has a linear shape, and wherein a lengthwise direction of the cell gate cutting pattern is parallel to the first direction.

10. The integrated circuit of claim 8,
wherein the cell gate cutting pattern includes first sidewall portions protruding toward the first gate stack and the second gate stack, and
wherein the first sidewall portions are in contact with the first gate stack and the second gate stack.

11. The integrated circuit of claim 8,
wherein the cell gate cutting pattern further includes second sidewall portions protruding away from the first gate stack and the second gate stack.

12. An integrated circuit comprising:
a first standard cell including a first p-type transistor and a first n-type transistor;
a second standard cell which includes a second p-type transistor and second n-type transistor and is disposed to be adjacent to the first standard cell in a first direction;
a filler cell which includes a first dummy gate stack and a second dummy gate stack disposed between the first standard cell and the second standard cell, the first dummy gate stack and the second dummy gate stack extending in a second direction different from the first direction; and
a power rail extending in the first direction and connected to the first dummy gate stack and the second dummy gate stack,
wherein:
the filler cell has a one-pitch dimension,
the first dummy gate stack and the second dummy gate stack are spaced the one-pitch dimension apart from each other in the first direction,
the first dummy gate stack of the filler cell is disposed at a boundary between the first standard cell and the filler cell,
the second dummy gate stack of the filler cell is disposed at a boundary between the second standard cell and the filler cell,
the first standard cell includes a first gate stack extending in the second direction,
the second standard cell includes a second gate stack extending in the second direction, and
a length of each of the first dummy gate stack and the second dummy gate stack is greater than a length of each of the first gate stack and the second gate stack.

13. The integrated circuit of claim 12, further comprising:
a cell separation film extending in the first direction along a boundary of the first standard cell, a boundary of the filler cell, and a boundary of the second standard cell,
wherein the filler cell includes a first filler contact connected to the first dummy gate stack, and a second filler contact connected to the second dummy gate stack, and
wherein the first filler contact and the second filler contact overlap the cell separation film.

14. The integrated circuit of claim 12, further comprising:
a cell gate cutting pattern extending in the first direction along a boundary of the first standard cell, a boundary of the filler cell, and a boundary of the second standard cell,
wherein the first gate stack, the second gate stack, the first dummy gate stack and the second dummy gate stack are in contact with the cell gate cutting pattern.

15. The integrated circuit of claim 14,
wherein a sidewall of the cell gate cutting pattern includes a first protruding portion protruding toward the first standard cell and a second protruding portion protruding toward the second standard cell, and wherein the first gate stack is in contact with the first protruding portion, and wherein the second gate stack is in contact with the second protruding portion.

16. An integrated circuit comprising:

a first standard cell including a first p-type transistor and a first n-type transistor;

a second standard cell which includes a second p-type transistor and a second n-type transistor and is spaced apart from the first standard cell in a first direction;

a filler cell which includes a first dummy gate stack and a second dummy gate stack disposed between the first standard cell and the second standard cell, a first filler contact connected to the first dummy gate stack, and a second filler contact connected to the second dummy gate stack, the first dummy gate stack and the second dummy gate stack extending in a second direction different from the first direction; and a power rail extending in the first direction and connected to the first dummy gate stack via the first filler contact and the second dummy gate stack via the second filler contact, wherein:

the filler cell has a one-pitch dimension, the first dummy gate stack and the second dummy gate stack are spaced the one-pitch dimension apart from each other in the first direction, the first dummy gate stack of the filler cell is disposed at a boundary between the first standard cell and the filler cell, the second dummy gate stack of the filler cell is disposed at a boundary between the second standard cell and the filler cell, the first p-type transistor and the second p-type transistor are formed on a first active region, the first n-type transistor and the second n-type transistor are formed on a second active region, the filler cell further includes a dummy gate cutting pattern on an active region separation film extending in the first direction across a space between the first active region and the second active region, the first dummy gate stack includes a first portion and a second portion separated by the dummy gate cutting pattern, the second dummy gate stack includes a first portion and a second portion separated by the dummy gate cutting pattern, the first filler contact includes a first upper filler contact connected to the first portion of the first dummy gate stack, and a first lower filler contact connected to the second portion of the first dummy gate stack, the second filler contact includes a second upper filler contact connected to the first portion of the second dummy gate stack, and a second lower filler contact connected to the second portion of the second dummy gate stack, and the first upper filler contact, the first lower filler contact, the second upper filler contact, and the second lower filler contact overlap a cell separation film extending in the first direction along a boundary of the first standard cell, a boundary of the filler cell, and a boundary of the second standard cell.

17. The integrated circuit of claim 16, wherein the first upper filler contact includes a first upper contact part, and a first upper via part on the first upper contact part, and the second upper filler contact includes a second upper contact part, and a second upper via part on the second upper contact part.

18. The integrated circuit of claim 17, wherein the first upper contact part is in contact with the second upper contact part.

19. The integrated circuit of claim 17, wherein the first upper via part is in contact with the second upper via part.

20. The integrated circuit of claim 16, wherein the power rail includes an upper power rail and a lower power rail which are spaced apart from each other in the second direction, the upper power rail is connected to the first upper filler contact and the second upper filler contact, and the lower power rail is connected to the first lower filler contact and the second lower filler contact.

* * * * *